US012162717B2

(12) United States Patent
Isobata et al.

(10) Patent No.: US 12,162,717 B2
(45) Date of Patent: Dec. 10, 2024

(54) COMPONENT SUPPLY DEVICE AND METHOD FOR OPERATING COMPONENT SUPPLY DEVICE

(71) Applicant: Panasonic Intellectual Property Management Co., Ltd., Osaka (JP)

(72) Inventors: Yoshinori Isobata, Fukuoka (JP); Atuyuki Horie, Fukuoka (JP); Chikara Takata, Fukuoka (JP); Kunimi Tsuzurugi, Fukuoka (JP); Kazunari Mishima, Fukuoka (JP); Kyourei Ri, Fukuoka (JP); Minoru Kitani, Fukuoka (JP); Tatsuo Yamamura, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 439 days.

(21) Appl. No.: 17/427,663

(22) PCT Filed: Jan. 27, 2020

(86) PCT No.: PCT/JP2020/002660
§ 371 (c)(1),
(2) Date: Aug. 2, 2021

(87) PCT Pub. No.: WO2020/183942
PCT Pub. Date: Sep. 17, 2020

(65) Prior Publication Data
US 2022/0135364 A1 May 5, 2022

(30) Foreign Application Priority Data

Mar. 11, 2019 (JP) .................................. 2019-043771

(51) Int. Cl.
*B65H 63/08* (2006.01)
*B65H 37/02* (2006.01)

(52) U.S. Cl.
CPC .......... *B65H 63/086* (2013.01); *B65H 37/02* (2013.01); *B65H 2511/518* (2013.01);
(Continued)

(58) Field of Classification Search
CPC .................................... H05K 13/0419
See application file for complete search history.

(56) References Cited

U.S. PATENT DOCUMENTS

2015/0147143 A1* 5/2015 Shimizu ............. H05K 13/0419
414/226.04
2017/0034969 A1* 2/2017 Eguchi ............... H05K 13/0419
(Continued)

FOREIGN PATENT DOCUMENTS

CN 104684374 A 6/2015
CN 113396645 A 9/2021
(Continued)

OTHER PUBLICATIONS

International Search Report of PCT application No. PCT/JP2020/002660 dated Apr. 14, 2020.
(Continued)

*Primary Examiner* — Sonya M Sengupta
(74) *Attorney, Agent, or Firm* — PEARNE & GORDON LLP

(57) ABSTRACT

The component supply device includes a body, a first carrier tape transporter, a second carrier tape transporter, and a controller. The body includes a tape transport path. The first carrier tape transporter transports a carrier tape to a component pickup position. The second carrier tape transporter transports the carrier tape to the first carrier tape transporter. The controller is configured to communicate with the component installation device and control the first carrier tape
(Continued)

transporter and the second carrier tape transporter in one operation mode selected from a plurality of operation modes.

10 Claims, 27 Drawing Sheets

(52) U.S. Cl.
CPC ...... *B65H 2551/20* (2013.01); *B65H 2553/40* (2013.01); *B65H 2701/377* (2013.01)

(56) References Cited

U.S. PATENT DOCUMENTS

2022/0132713 A1* 4/2022 Isobata .................. B65H 20/20
2022/0135364 A1* 5/2022 Isobata ................ B65H 63/086
156/350

FOREIGN PATENT DOCUMENTS

| JP | 2017-033968 | 2/2017 |
| JP | 2017-118008 A | 6/2017 |
| JP | 2018-041881 | 3/2018 |

OTHER PUBLICATIONS

English Translation of Chinese Search Report dated Feb. 21, 2023 for the related Chinese Patent Application No. 202080017928.4.
English Translation of Chinese Search Report dated Aug. 29, 2022 for the related Chinese Patent Application No. 202080017928.4.

* cited by examiner

A-A CROSS SECTION

B-B CROSS SECTION

C-C CROSS SECTION

D-D CROSS SECTION

E-E CROSS SECTION

F-F CROSS SECTION

COMPONENT SUPPLY DEVICE AND METHOD FOR OPERATING COMPONENT SUPPLY DEVICE

TECHNICAL FIELD

The present disclosure relates to a component supply device that supplies a component stored in a carrier tape to a component installation device, and a method for operating a component supply device.

BACKGROUND ART

In a component installation device that installs a component on a board, a tape feeder, which pitch-feeds a carrier tape holding the component to supply the component to a component pickup position by a component mounting mechanism, is often used as a component supply device. As a method for supplying the component in such a tape feeder, a splicing method in which a new carrier tape (succeeding tape) is connected to an end portion of an already installed preceding carrier tape (preceding tape) by a splicing tape has been widely used. In this splicing method, an operator needs to perform complicated work every time a supply reel is replaced, and it has been desired to reduce these workloads. For this reason, as a new tape supply method, a tape feeder of a so-called automatic loading method has been used, in which the succeeding tape is automatically loaded and tape-fed by simply setting the succeeding tape in the tape feeder without performing splicing work.

At a production site of mounting board manufacturing, the above-mentioned splicing method and the automatic loading method are mixed to be used, and in order to apply these methods, two types of tape feeders having dedicated configuration and function are required. These two types of tape feeders are often incompatible in relation to the carrier tape to be used, and when a carrier tape that is not compatible with this tape feeder is accidentally attached to the tape feeder, the component not only cannot be supplied normally but also there is a risk of a problem such as damage to the equipment.

Therefore, in the conventional mounting board manufacturing system, a component supply system having a function of preventing abnormalities due to misuse of these two types of tape feeders has been proposed (see, for example, PTL 1). In the prior art illustrated in this PTL example, in a case where a carrier tape of a splicing method is set in a tape feeder of an automatic loading method, a splicing tape joint portion is detected by a sensor. If the joint portion is detected, it is determined that the carrier tape is the carrier tape of the splicing method that is not subject to automatic loading, and the tape feed is restricted.

CITATION LIST

Patent Literature

PTL 1: Japanese Patent Unexamined Publication NO. 2017-33968

SUMMARY OF THE INVENTION

A component supply device of the present disclosure is a component supply device configured to supply a component stored in a carrier tape to a component installation device.

The component supply device includes a body, a first carrier tape transporter, a second carrier tape transporter, and a controller.

The body includes a tape transport path that guides the carrier tape from an insertion port to a discharge port.

The first carrier tape transporter is disposed at a downstream portion of the tape transport path and transports the carrier tape to a component pickup position.

The second carrier tape transporter transports the carrier tape from upstream of the tape transport path to the first carrier tape transporter.

The controller is configured to communicate with the component installation device and control the first carrier tape transporter and the second carrier tape transporter in one operation mode selected from a plurality of operation modes.

In a state where a preceding carrier tape and a succeeding carrier tape are not connected, a component stored in the carrier tape can be supplied to the component installation device by feeding the succeeding carrier tape following the preceding carrier tape to a component pickup position.

A method for operating a component supply device of the present disclosure is a method for operating a component supply device configured to supply a component to a component installation device by feeding a carrier tape to a component pickup position.

The component installation device includes a body, a first carrier tape transporter, a second carrier tape transporter, a detector, and a controller.

The body includes a tape transport path that guides the carrier tape from an insertion port to a discharge port.

The first carrier tape transporter is disposed at a downstream portion of the tape transport path and transports the carrier tape to a component pickup position.

The second carrier tape transporter transports the carrier tape from upstream of the tape transport path to the first carrier tape transporter.

The detector detects a connecting portion between the preceding carrier tape and the succeeding carrier tape passing through the tape transport path, or an end portion of the carrier tape.

The controller controls the first carrier tape transporter and the second carrier tape transporter.

The method for operating a component supply device operates in one operation mode selected from a plurality of operation modes having a first operation mode and a second operation mode, when the first operation mode is selected, performs a first notification to the component installation device when the detector detects a passage of a rear end of the preceding carrier tape, and performs a second notification to the component installation device when a component stored in the succeeding carrier tape following the preceding carrier tape is stopped at the component pickup position, and when the second operation mode is selected, performs a third notification to the component installation device when the detector detects the passage of the rear end of the carrier tape, and performs a fourth notification to the component installation device when the detector detects the connecting portion between the preceding carrier tape and the succeeding carrier tape.

DESCRIPTION OF EMBODIMENTS

Although the conventional technology can prevent problems caused by incorrect installation of an incompatible carrier tape, a component cannot be supplied by applying the automatic loading method and the conventional splicing method with the same tape feeder. That is, at a production site where the automatic loading method and the splicing method are used in a mixed manner, it is necessary to prepare two types of dedicated tape feeders suitable for these two types of methods and properly use the tape feeder as a component supply device according to a component supply method to be adopted. Therefore, there has been a demand for a component supply device capable of supplying the component by either the automatic loading method or the splicing method.

Next, exemplary embodiments of the present disclosure will be described with reference to the drawings. First, a configuration of mounting board manufacturing system 100 according to the present exemplary embodiment will be described with reference to FIG. 1. Mounting board manufacturing system 100 has a function of installing a component on a board to manufacture a mounting board. Mounting board manufacturing system 100 includes tape feeder 1 which is a component supply device, and component installation device M which picks up a component from a component pickup position of tape feeder 1 and installs the component in board 103. In the present exemplary embodiment, in a state where a preceding carrier tape and a succeeding carrier tape are not connected, tape feeder 1 is configured to supply a component stored in the succeeding carrier tape following the preceding carrier tape to a component pickup position.

Figure 1:
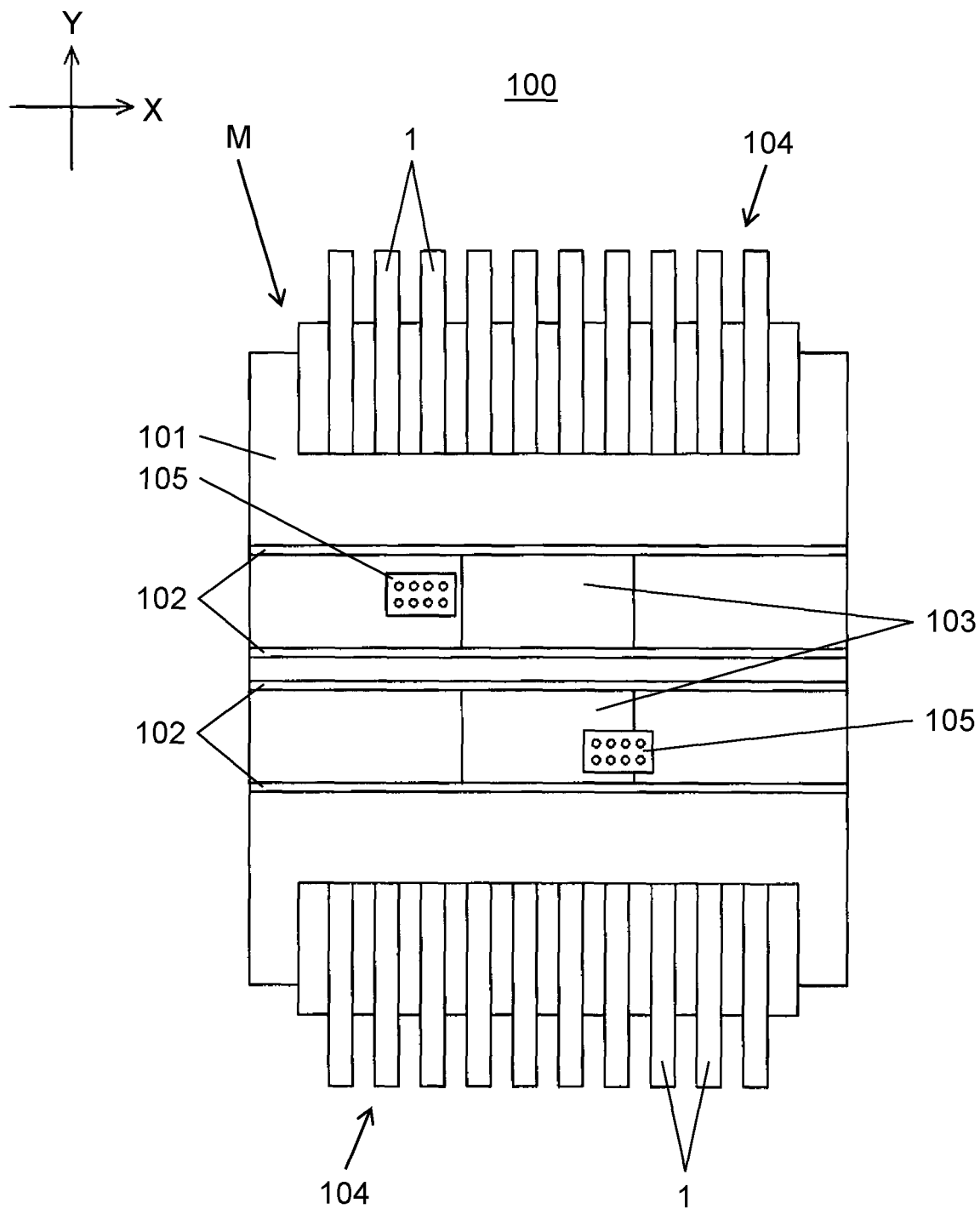
FIG. 1 is a configuration explanatory view of a mounting board manufacturing system according to an exemplary embodiment of the present disclosure.

An overall configuration of component installation device M will be described. In FIG. 1, two sets of board transport mechanisms 102 are disposed in an X direction (board transport direction) in base 101. Board transport mechanism 102 receives board 103 of a component installation target from an upstream-side device, transports board 103 to an installation work position by installation head 105 to position board 103. On both sides of board transport mechanism 102, component suppliers 104, in which tape feeders 1 which are a plurality of component supply devices are installed, are disposed. Component supplier 104 includes a plurality of slots for installing tape feeders 1. The slot number is set for each slot, and in a production program, a supply position of the component or an installation position of tape feeder 1 that supplies the component is determined by the slot number.

Above base 101, installation heads 105 are movably disposed in the X direction and a Y direction, corresponding to the respective component suppliers 104. Installation head 105 includes a plurality of component holding nozzles, and picks up the component from component pickup position 4c (see FIG. 2) of tape feeder 1 installed in each corresponding component supplier 104, transfers the component to board 103 held by board transport mechanism 102, and installs the component in board 103.

Figure 2:
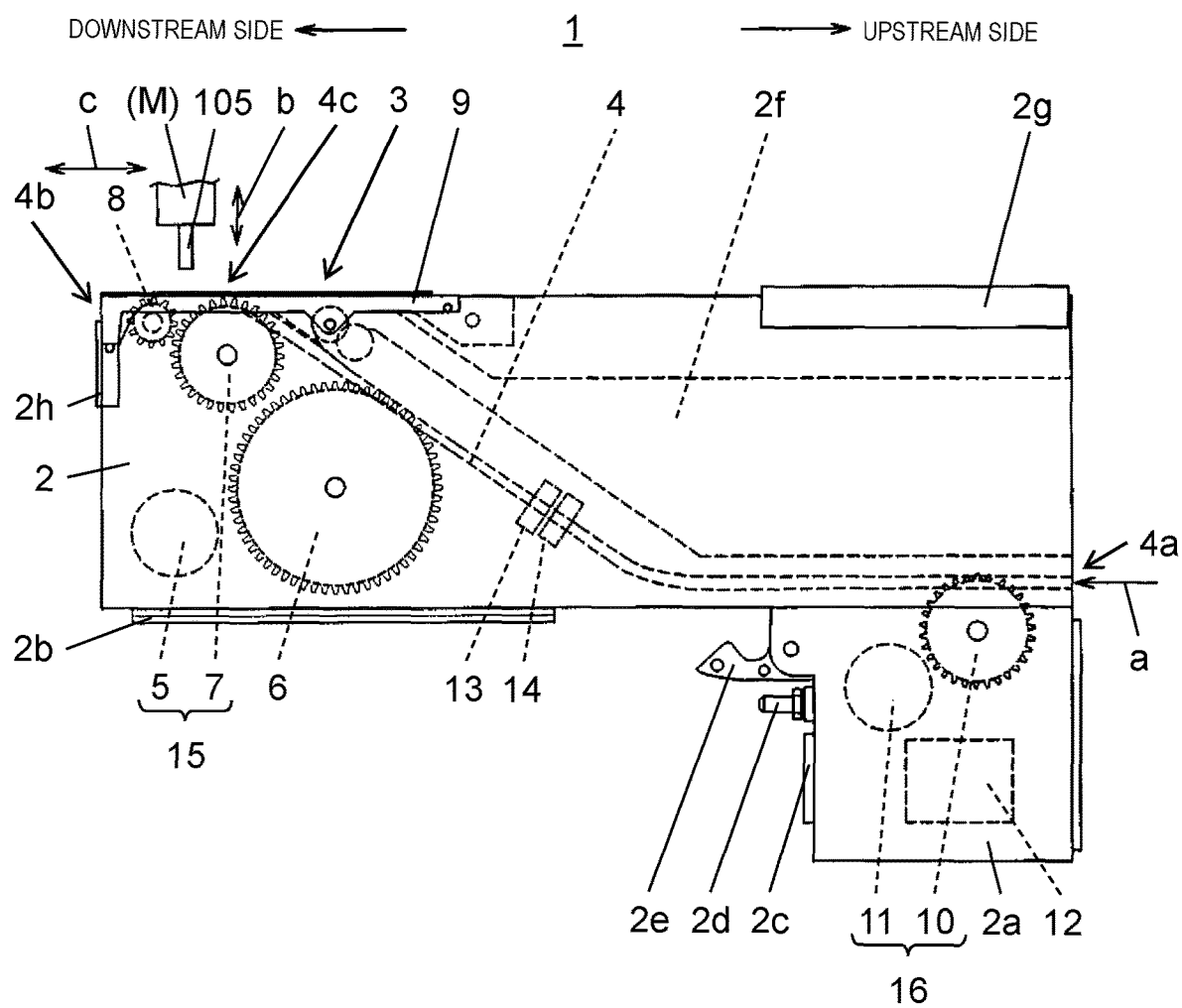
FIG. 2 is a configuration explanatory view illustrating an overall configuration of a component supply device according to an exemplary embodiment of the present disclosure.
Figure 25:
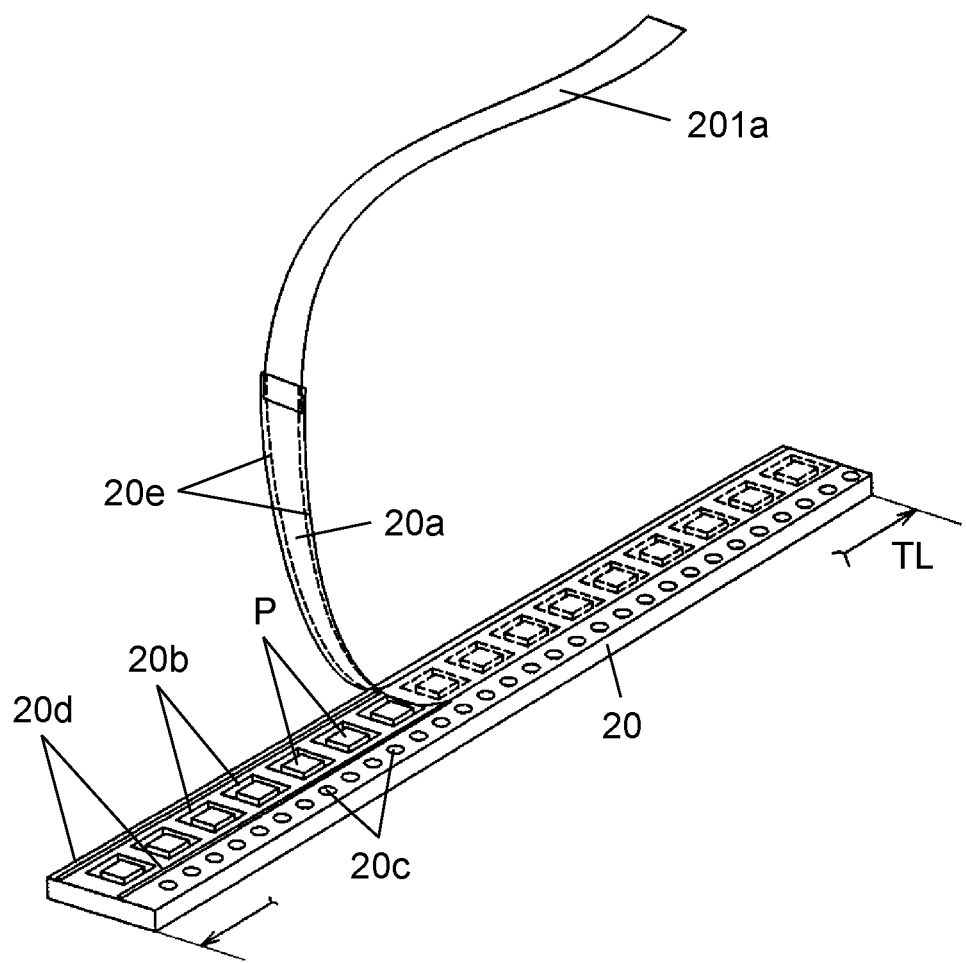
FIG. 25 is a perspective view of a carrier tape which is a work target in the component supply device of the exemplary embodiment of the present disclosure.

An overall configuration of tape feeder 1 will be described with reference to FIG. 2. Tape feeder 1 has a function of supplying the component stored in carrier tape 20 for the component supply, to component installation device M. As illustrated in FIG. 25, carrier tape 20 is formed with storage portions 20b for storing components P which are mounting targets and feed holes 20c for transport at regular intervals. The transport of carrier tape 20 is performed by rotating a sprocket provided with an engagement pin that engages with feed hole 20c. An upper surface of carrier tape 20 is covered with cover tape 20a for sealing storage portion 20b.

Cover tape 20a is adhered to carrier tape 20 via an adhesive portion formed by an adhesive on an adhesion interface with carrier tape 20. In a state where cover tape 20a is peeled off from carrier tape 20, in the adhesion interface (surface of carrier tape 20 and rear surface of cover tape 20a) between carrier tape 20 and cover tape 20a, marks 20d and 20e of respective adhesive portions remain and adhere to each other.

When component P is supplied by tape feeder 1, cover tape 20a is peeled off from carrier tape 20 to open storage portion 20b. Component P is picked up from opened storage portion 20b at the component pickup position set in the vicinity of a downstream end portion of tape feeder 1, and is supplied to the component installation device. In the present exemplary embodiment, carrier tape 20 supplied by tape feeder 1 includes not only hoop-shaped carrier tape 20 which is a normal supply form but also short tape 201 cut by amorphous length dimension TL as illustrated in FIG. 25. Therefore, in the present exemplary embodiment described below, consideration is given such that tape installing work can be performed on such short tape 201 with good workability.

Tape feeder 1 is configured by disposing elements described below on body 2 formed of a plate-shaped frame. These elements are covered by side covers (not illustrated) provided on both sides. As illustrated in FIG. 2, body 2 includes tape transport path 4 that guides carrier tape 20 from insertion port 4a which is open at a lower portion on an upstream side to discharge port 4b set in the vicinity of an end portion of an upper surface on a downstream side.

Carrier tape 20 introduced (arrow a) from insertion port 4a into tape transport path 4 is transported to the upper surface of body 2 via an oblique portion provided in a middle of body 2 and reaches component pickup position 4c. At component pickup position 4c, installation head 105 of component installation device M moves up and down (arrow b) to perform a component pickup operation, so that component P is picked up from storage portion 20b. Picked-up component P is transferred (arrow c) to the component installation device by installation head 105 and mounted on a board of a work target. The transport of carrier tape 20 in the above-mentioned component supply is performed by tape transporter 3 described below.

Tape transporter 3 includes first motor 5, transport sprocket 6, positioning sprocket 7, and discharge sprocket 8. By driving transport sprocket 6, positioning sprocket 7, and discharge sprocket 8 by first motor 5 which is a driving source, carrier tape 20 inserted from insertion port 4a is transported into tape feeder 1 and is positioned at component pickup position 4c. Tape transporter 3 is covered with opening/closing cover 9, and engagement of carrier tape 20 with positioning sprocket 7 and discharge sprocket 8 is performed by pressing carrier tape 20 to positioning sprocket 7 and discharge sprocket 8 by opening/closing cover 9.

In a tape transporting process for transporting carrier tape 20 along tape transport path 4 by tape transporter 3, cover tape 20a peeled off from carrier tape 20 is folded back to the upstream side, and is collected in cover tape storage unit 2f provided in body 2. Carrier tape 20 after component P is picked up at component pickup position 4c is discharged to the downstream side of tape feeder 1 by discharge sprocket 8 via front cover 2h disposed on an end surface of body 2.

That is, positioning sprocket 7 is a first sprocket for transporting carrier tape 20 to downstream component pickup position 4c by rotating in engagement with feed hole 20c of carrier tape 20. Discharge sprocket 8 is a second sprocket positioned downstream of component pickup position 4c for transporting carrier tape 20 by rotating in engagement with feed holes 20c of carrier tape 20 from component pickup position 4c to discharge port 4b. Thus, in the present exemplary embodiment, component pickup position 4c is configured to be disposed between positioning sprocket 7 that is the first sprocket and discharge sprocket 8 that is the second sprocket.

By adopting such a configuration, even when the component is supplied by using short tape 201 illustrated in FIG. 25, all storage portions 20b of carrier tape 20 can be positioned at component pickup position 4c. Thus, storage portion 20b, in which the component pickup is not performed at component pickup position 4c, does not occur and occurrence of component loss can be prevented.

Positioning sprocket 7 and first motor 5 are disposed at the downstream portion of tape transport path 4, and constitute first carrier tape transporter 15 that transports carrier tape 20 to component pickup position 4c. In the present exemplary embodiment, second carrier tape transporter 16 is provided, which transports carrier tape 20 introduced from insertion port 4a, from upstream of tape transport path 4 to first carrier tape transporter 15. That is, in tape transport path 4, second carrier tape transporter 16 having a configuration, in which tape carry-in sprocket 10 is rotationally driven by second motor 11, is disposed in the vicinity of the downstream side of insertion port 4a.

First tape detector 13 and second tape detector 14 using optical sensors are provided at the oblique portion (see climbing section 4e illustrated in FIG. 7) of tape transport path 4 between first carrier tape transporter 15 and second carrier tape transporter 16. First tape detector 13 is a carrier tape detector that detects presence or absence of carrier tape 20 transported from the upstream side in tape transport path 4. By optically detecting a predetermined portion such as an end portion of carrier tape 20, carrier tape 20 present at the position of first tape detector 13 is detected.

Second tape detector 14 is a connecting portion detector that detects a connecting portion that connects preceding carrier tape 20 and succeeding carrier tape 20. That is, in a so-called splicing method in which preceding and succeeding two carrier tape 20 of supplied carrier tapes 20 are connected in advance and continuously supplied, a connecting member (splicing tape) connecting two carrier tapes 20 is optically detected so that it is detected that the connecting portion reaches second tape detector 14.

That is, first tape detector 13 and second tape detector 14 are detector for detecting the connecting portion between preceding carrier tape 20 and succeeding carrier tape 20 or the end portion of carrier tape 20 in tape transport path 4. The component supply device according to the present exemplary embodiment has second tape detector 14 as a connecting portion detector that detects the connecting portion, and first tape detector 13 as a carrier tape detector that detects the presence or absence of carrier tape 20 in tape transport path 4. The component supply device performs the detection of the connecting portion and the detection of the presence or absence of carrier tape 20 with dedicated detector.

Instead of providing first tape detector 13 and second tape detector 14 as the above-mentioned dedicated detector together, the connecting portion and the presence or absence of carrier tape 20 in tape transport path 4 may be detected by an optical sensor provided with first tape detector 13. In this case, the above-mentioned detector is a common optical sensor that detects the connecting portion and the presence or absence of carrier tape 20 in tape transport path 4. In a case where the connecting portion is a connecting tape having a color different from that of the carrier tape, a color sensor capable of detecting the difference in color is used as the optical sensor. With the color sensor, it is possible to detect the presence or absence of carrier tapes of various materials (colors), and also to reliably detect the connecting tape attached to the carrier tape by utilizing the difference in color. The requirement that the connecting portion and the presence or absence of the carrier tape are detected by one sensor can be satisfied.

On a lower surface of body 2, convex portion 2a for connecting to component installation device M (see FIG. 1) and fitting rail 2b are provided. By installing fitting rail 2b on a feeder base provided in the component supplier of component installation device M, tape feeder 1 is set at a predetermined position of the component supplier. Convex portion 2a includes connector 2c, air joint 2d, and hook 2e. In a state where tape feeder 1 is set on the feeder base, connector 2c and air joint 2d are fitted to a mating side (component installation device side) to be in a connected state. At this time, tape feeder 1 is located to be fixed to the feeder base by hook 2e. In this connected state, power supply and air supply from the component installation device to tape feeder 1, and signal transferring between the component installation device and tape feeder 1 can be performed.

Feeder controller 12 (controller) that controls an operation of tape feeder 1 is built in convex portion 2a. In a state where tape feeder 1 is connected to component installation device M, feeder controller 12 is electrically connected to a device controller of component installation device M via connector 2c. Accordingly, an operation command from the device controller of component installation device M is transmitted to tape feeder 1, and an operation feedback signal of a component supply operation by tape feeder 1 is transmitted to component installation device M.

Operation panel 2g, which is located on the upstream side, is provided on the upper surface of body 2. Operation panel 2g includes button 41, display unit 42, and lamp 43 (see FIG. 14) connected to feeder controller 12. By operating button 41, a predetermined operation input is performed on tape feeder 1. Display unit 42 is a small display panel, a segment type display unit, or the like, and displays an operation state of tape feeder 1. Lamp 43 is a display lamp for notification, and when lamp 43 turns on, notification of an abnormality alarm or the like is performed.

Next, detailed configurations of tape transporter 3 and opening/closing cover 9 will be described with reference to FIGS. 2 to 6. As illustrated in FIG. 2, opening/closing cover 9 is fitted openably and closably to an upper end surface of body 2 so as to cover the downstream side of tape transport path 4. As illustrated in FIG. 6, opening/closing cover 9 is an elongated member having a substantially gate-shaped cross section (see FIGS. 5A to 5E) of which a lower surface side is open.

Opening/closing cover 9 includes a pair of side surface portions 9g extending downward from both side ends of a top surface forming the gate shape. Locking pin 9i is provided at an end portion on the upstream side of opening/closing cover 9 by connecting the pair of side surface portions 9g. A pair of hanging portions 9j extending downward from side surface portion 9g are provided at an end portion on the downstream side of opening/closing cover 9. Hanging portions 9j are connected by fixing pin 9h.

Figure 3:
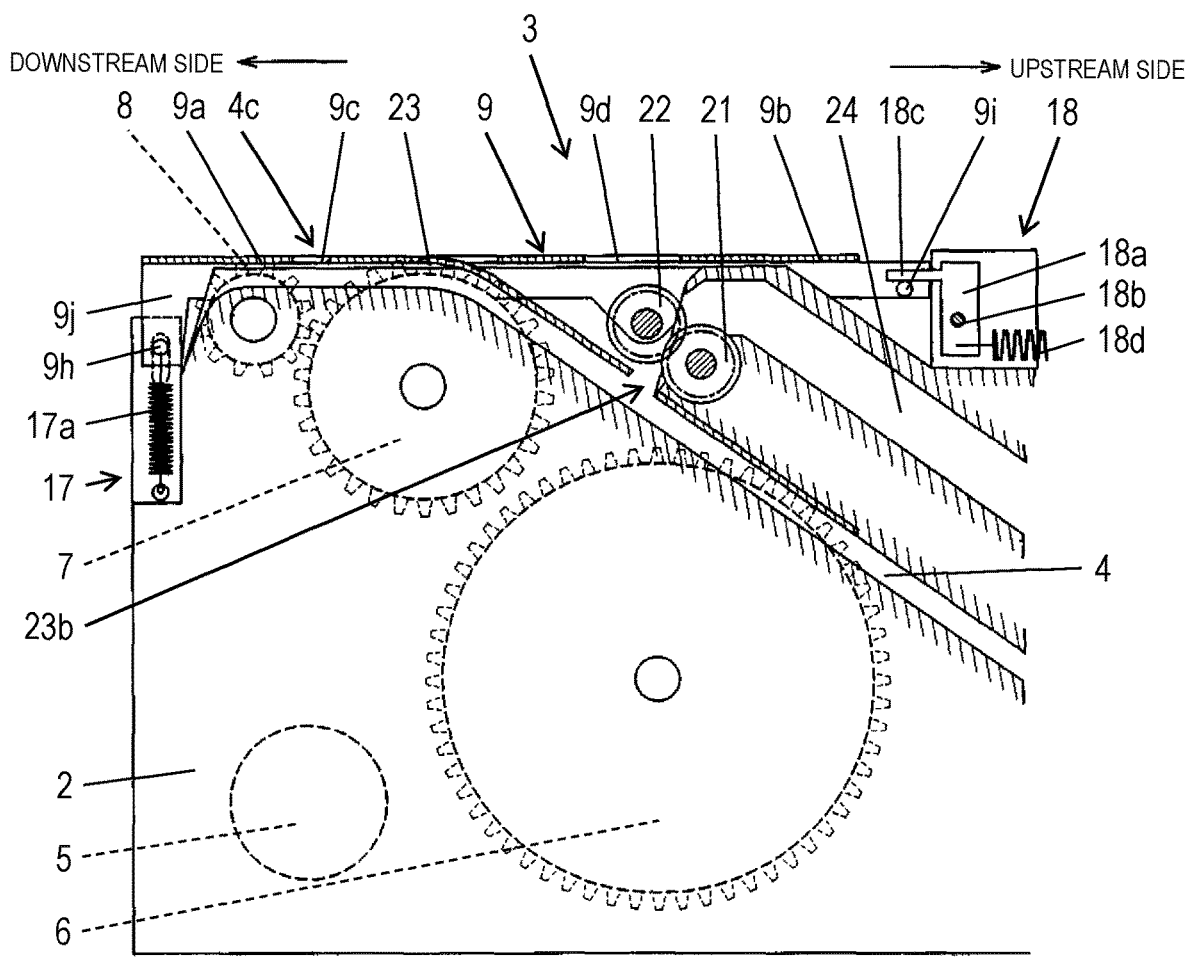
FIG. 3 is a partial sectional view of the component supply device of the exemplary embodiment of the present disclosure.

As illustrated in FIG. 3, opening/closing cover holder 17 for holding opening/closing cover 9 is provided at a tip portion on the downstream side of body 2. In body 2, opening/closing cover locking unit 18 for locking the end portion on the upstream side of opening/closing cover 9 is provided on the upstream side of opening/closing cover holder 17. In a state where opening/closing cover 9 is fitted to body 2, fixing pin 9h at an end portion on the downstream side of opening/closing cover 9 is pivotally supported by a vertically long elongated hole provided at opening/closing cover holder 17, and is urged downward by urging spring 17a provided in opening/closing cover holder 17.

In a state where opening/closing cover 9 is closed with respect to body 2, locking pin 9i provided at the end portion on the upstream side of opening/closing cover 9 is locked by opening/closing cover locking unit 18. Opening/closing cover locking unit 18 includes locking block 18a provided with locking member 18c capable of locking to locking pin 9i and pivotally supported by pivot pin 18b. Urging spring 18d that urges locking member 18c in a pushing down direction is connected to locking block 18a. Therefore, in a state where opening/closing cover 9 is closed, locking pin 9i is pushed down by locking member 18c to be locked.

Figure 4A:
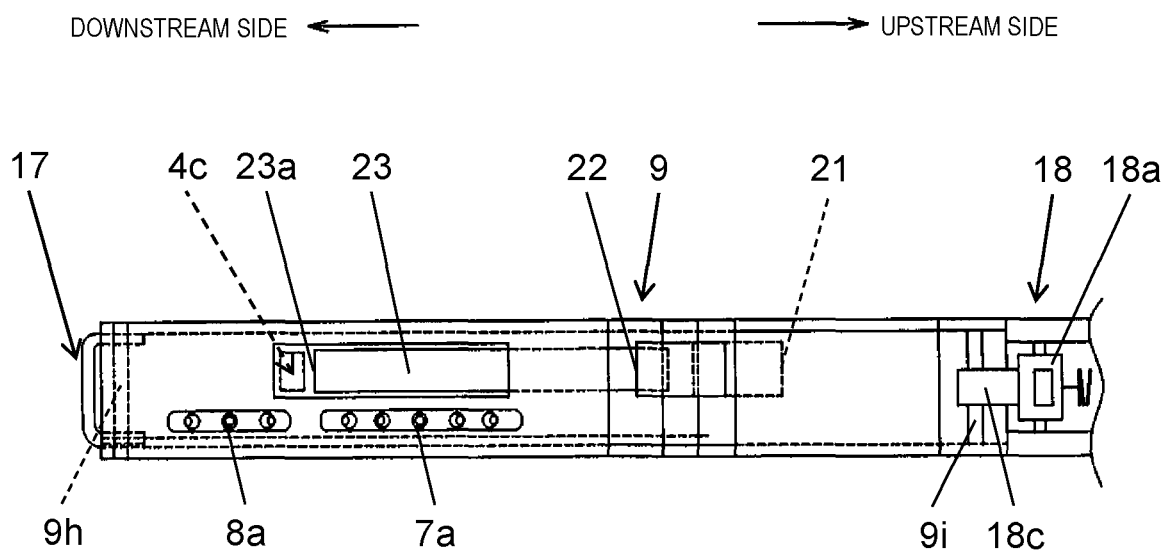
FIG. 4A is a plan view of an opening/closing cover of the component supply device of the exemplary embodiment of the present disclosure.
Figure 4B:
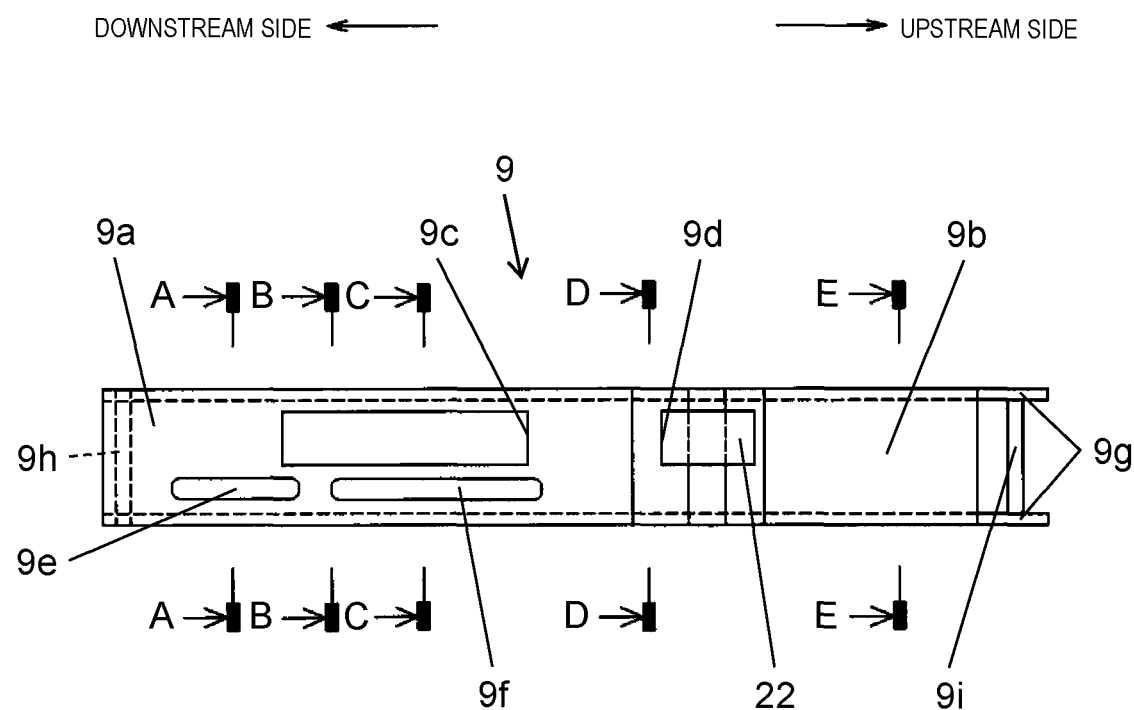
FIG. 4B is a schematic plan view of the opening/closing cover of the component supply device according to the exemplary embodiment of the present disclosure.

FIG. 3 illustrates the upper surface of opening/closing cover 9 in a state of being fitted to body 2 in this way. FIG. 4A illustrates the disposition of the opening portions on an upper surface of opening/closing cover 9. As illustrated in FIG. 4B, flat first cover portion 9a and second cover portion 9b are provided on the upper surface of opening/closing cover 9. First cover portion 9a and second cover portion 9b cover above tape transport path 4 in a state where opening/closing cover 9 is fitted to body 2. That is, opening/closing cover 9 has a cover portion (first cover portion 9a and second cover portion 9b) that covers above tape transport path 4.

On the upper surface of opening/closing cover 9, first opening portion 9c, second opening portion 9d, first relief portion 9e, and second relief portion 9f are provided as openings. First opening portion 9c is an opening for picking up the component, and an end portion region on a downstream side of first opening portion 9c coincides with component pickup position 4c in tape transport path 4. A downstream portion of tape guide 23 described below is fitted into first opening portion 9c on the upstream side of component pickup position 4c. As described later, in a case where setting of carrier tape 20 is manually performed, the end portion on the downstream side of tape guide 23 has a function of peeler 23a for peeling off cover tape 20a from carrier tape 20 by folding back cover tape 20a at the end portion.

Second opening portion 9d is formed at a position corresponding to driven roller 22 described below. Therefore, in a state where opening/closing cover 9 is closed, it is possible to access driven roller 22 from above. In a state where opening/closing cover 9 is lowered with respect to body 2 and closed, first relief portion 9e and second relief portion 9f are provided to relieve engagement pin 7a of positioning sprocket 7 and engagement pin 8a of discharge sprocket 8 respectively.

Figure 5A:
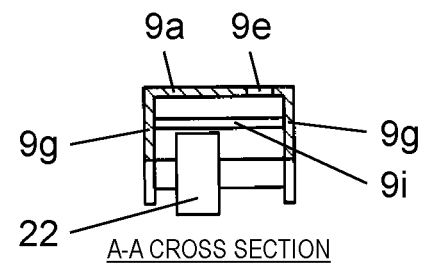
FIG. 5A is a sectional view which is taken along line A-A of FIG. 4B.
Figure 5B:
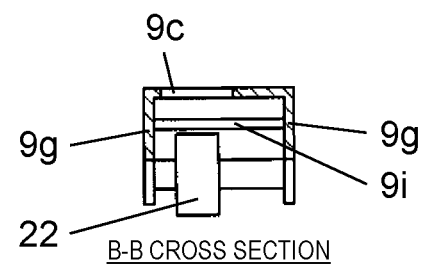
FIG. 5B is a sectional view which is taken along line B-B of FIG. 4B.
Figure 5C:
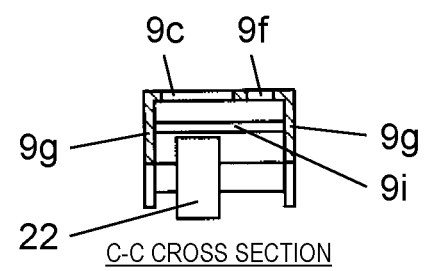
FIG. 5C is a sectional view which is taken along line C-C of FIG. 4B.
Figure 5D:
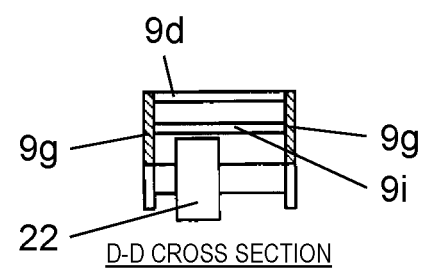
FIG. 5D is a sectional view which is taken along line D-D of FIG. 4B.
Figure 5E:
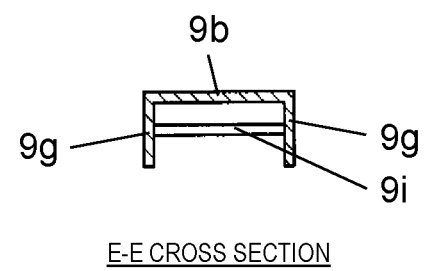
FIG. 5E is a sectional view which is taken along line E-E of FIG. 4B.
Figure 6:
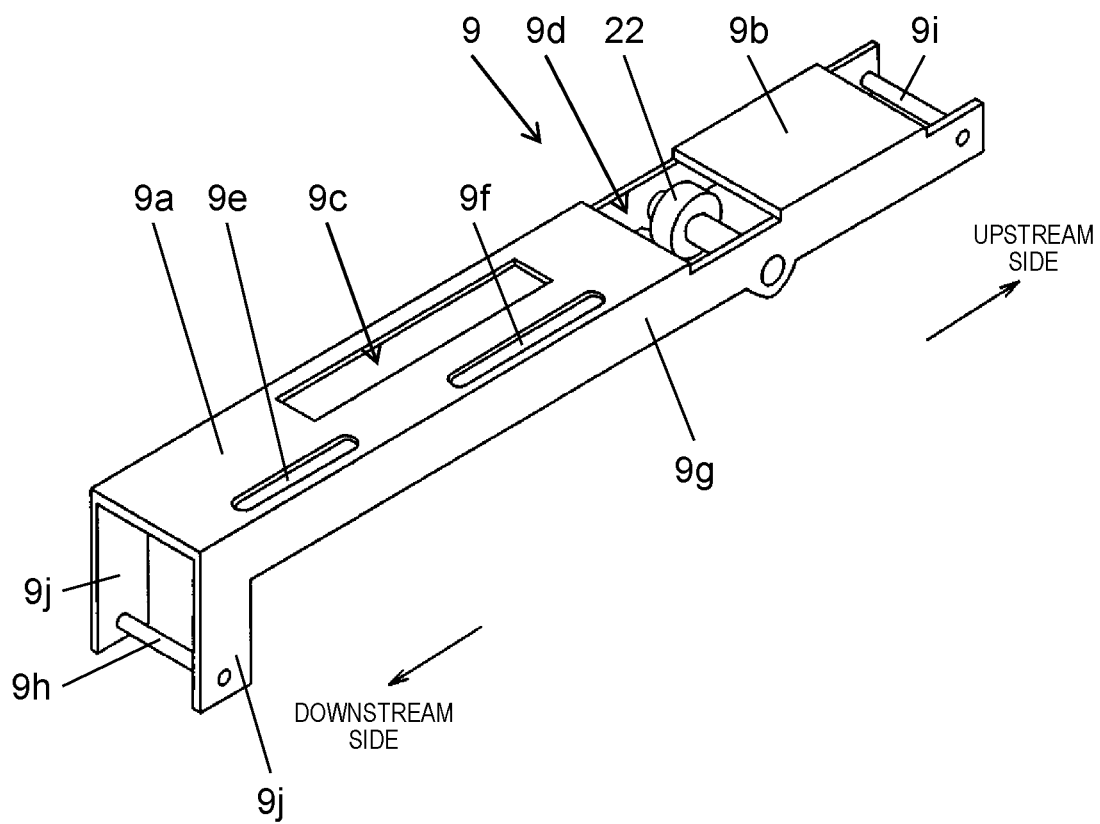
FIG. 6 is a perspective view of the opening/closing cover of the component supply device of the exemplary embodiment of the present disclosure.

FIG. 5A is a sectional view which is taken along line A-A of opening/closing cover 9 of FIG. 4B. FIG. 5B is a sectional view which is taken along line B-B of opening/closing cover 9 of FIG. 4B. FIG. 5C is a sectional view which is taken along line C-C of opening/closing cover 9 of FIG. 4B. FIG. 5D is a sectional view which is taken along line D-D of opening/closing cover 9 of FIG. 4B. FIG. 5E is a sectional view which is taken along line E-E of opening/closing cover 9 of FIG. 4B. In each of the cross sections illustrated in FIGS. 5A to 5E, the upper surface, side surface portions 9g, and locking pin 9i, which form the gate type cross section of opening/closing cover 9, appear. In FIG. 5A, first cover portion 9a and first relief portion 9e of the upper surface, and driven roller 22 appear. In FIG. 5B, first opening portion 9c provided on the upper surface and driven roller 22 appear. In FIG. 5C, first opening portion 9c and second relief portion 9f provided on the upper surface, and driven roller 22 appear. In FIG. 5D, second opening portion 9d provided on the upper surface and driven roller 22 appear. In FIG. 5E, second cover portion 9b of the upper surface and locking pin 9i appear.

Tape transporter 3 includes plate-shaped tape guide 23 disposed along the upper surface of tape transport path 4 so as to cover above transport sprocket 6 and positioning sprocket 7. Tape guide 23 has a function of guiding the upper surface of carrier tape 20 which is transported along tape transport path 4. As illustrated in FIG. 3, Tape guide 23 includes opening portion 23b for communicating tape transport path 4 upward. Above opening portion 23b, a pair of rollers are disposed, having a configuration in which driving roller 21 and driven roller 22 of cover tape 20a mesh with each other for peeling-off and discharging.

An air ejection hole (not illustrated) having a function of injecting air at a predetermined timing is open at a position facing opening portion 23b on a bottom surface of tape transport path 4. The tip of cover tape 20a attached to carrier tape 20 is blown up by the air injected from the air ejection hole. Therefore, cover tape 20a can be introduced between driving roller 21 and driven roller 22. In this state, by rotating driving roller 21 and driven roller 22, cover tape 20a can be discharged to cover tape storage unit 2f via cover tape discharge path 24 while cover tape 20a is peeled off from carrier tape 20.

Therefore, driving roller 21 and driven roller 22 have a function as a peeler for peeling off cover tape 20a from carrier tape 20 upstream of component pickup position 4c. Driving roller 21 and driven roller 22 have a function of discharging cover tape 20a peeled off by the peeler to cover tape storage unit 2f. That is, in this case, the peeler including driving roller 21 and driven roller 22 has an automatic peeling-off function of peeling off cover tape 20a automatically. This automatic peeling-off function is used in an automatic loading mode in which carrier tape 20 is automatically loaded.

Of the pair of rollers, one driving roller 21 is fixedly disposed in body 2, and is rotationally driven by a driving mechanism (see FIG. 8) by using first motor 5 as a driving source. Of the pair of rollers, other driven roller 22 is pivotally supported by side surface portions 9g of opening/closing cover 9, and is rotated by meshing with driving roller 21. That is, in the present exemplary embodiment, opening/closing cover 9 has driven roller 22, whereby driven roller 22 can be attached/detached together with opening/closing cover 9, and when carrier tape 20 is installed to tape feeder 1, cover tape 20a can be easily set.

Positioning sprocket 7 that is the first sprocket, discharge sprocket 8 that is the second sprocket, and driving roller 21 and driven roller 22 that are the pair of rollers are disposed below opening/closing cover 9. With such a configuration, driving roller 21 and driven roller 22 can be disposed at a position close to component pickup position 4c, and has a configuration which is suitable for the case of short tape 201 as a target.

Figure 7:
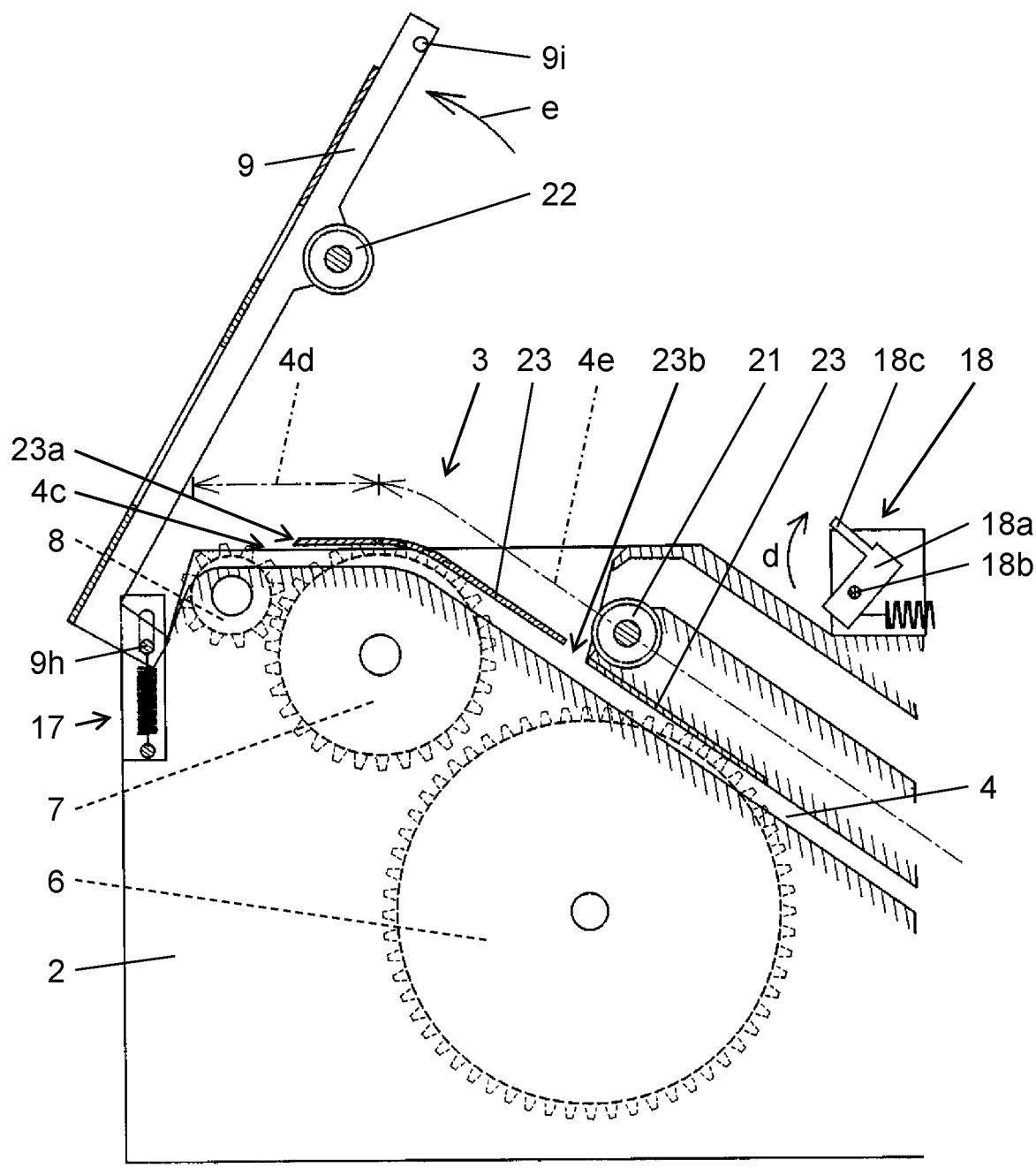
FIG. 7 is a partial sectional view of the component supply device of the exemplary embodiment of the present disclosure.

FIG. 7 illustrates a state where opening/closing cover 9 is opened to expose tape transporter 3 and tape transport path 4. That is, first, in opening/closing cover locking unit 18, locking block 18a is pivoted (arrow d) around pivot pin 18b to release the locking of locking pin 9i by locking member 18c. Therefore, in a state where fixing pin 9h on the downstream side is pivotally supported by opening/closing cover holder 17, opening/closing cover 9 can be opened (arrow e). At this time, meshing of driven roller 22 with driving roller 21 is released and driven roller 22 moves together with opening/closing cover 9. In this state, tape transport path 4 and tape guide 23 covering tape transport path 4 are in an exposed state.

As illustrated in FIG. 7, in tape transport path 4, a range downstream of an apex of positioning sprocket 7 is flat section 4d in which tape transport path 4 is flat, and a range upstream of flat section 4d is climbing section 4e from the lower portion to the upper surface of body 2. Component pickup position 4c for picking up component P is disposed in flat sections 4d. Driving roller 21 and driven roller 22, which are the pair of rollers, are disposed in a space sandwiched between upstream climbing section 4e and opening/closing cover 9.

Above tape transport path 4 upstream of component pickup position 4c from climbing section 4e, tape guide 23 covering tape transport path 4 is provided separately from opening/closing cover 9 and fixed to body 2. Opening portion 23b provided in tape guide 23 is located at a meshing portion between driving roller 21 and driven roller 22. Therefore, cover tape 20a peeled off from carrier tape 20, which is transported through tape transport path 4, can be sandwiched between driving roller 21 and driven roller 22, and be discharged.

In a case where carrier tape 20 is loaded without using the automatic loading function included in tape feeder 1, cover tape 20a is folded back around an edge on the downstream side of tape guide 23 to allow cover tape 20a to be peeled off from carrier tape 20. That is, in this case, the edge on the downstream side of tape guide 23 functions as a peeler for peeling off cover tape 20a from carrier tape 20 upstream of component pickup position 4c (see FIG. 10). The edge on the downstream side of tape guide 23 functions as a guide when short tape 201, which is cut short, is loaded into tape transport path 4 (see FIG. 11).

Figure 8:
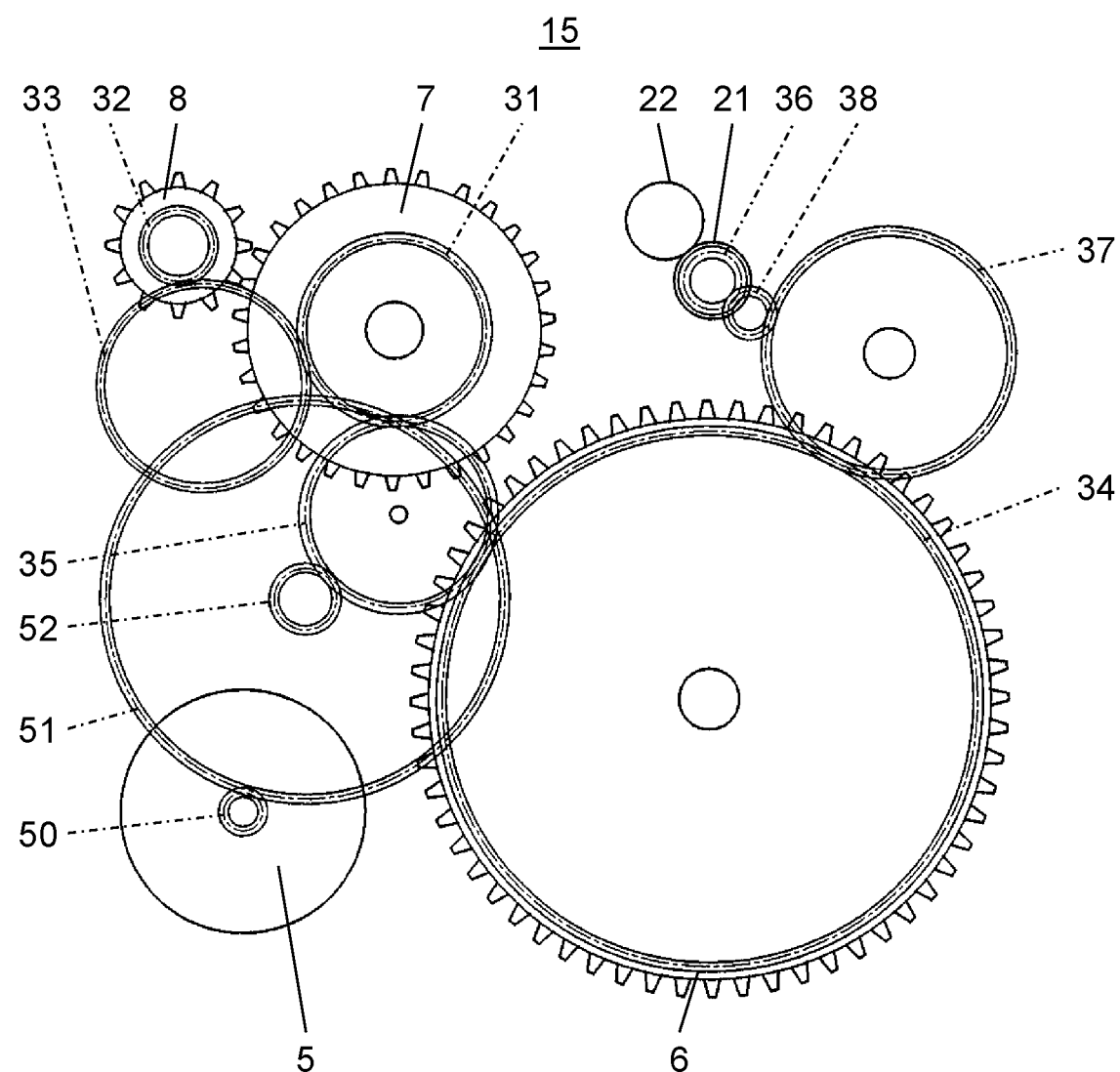
FIG. 8 is an explanatory view of a driving mechanism of a tape transporter in the component supply device of the exemplary embodiment of the present disclosure.

A configuration of the driving mechanism in first carrier tape transporter 15 will be described with reference to FIG. 8. In FIG. 8, first transmission gear 51 meshes with driving gear 50 coupled to a rotation shaft of first motor 5, and third transmission gear 35 meshes with second transmission gear 52 provided coaxially with first transmission gear 51. Third transmission gear 35 meshes with positioning sprocket gear 31 provided coaxially with positioning sprocket 7, which positions carrier tape 20, and transport sprocket gear 34 (fourth gear) provided coaxially with transport sprocket 6 which transports carrier tape 20 until positioning sprocket 7.

Positioning sprocket gear 31 meshes with fourth transmission gear 33 for transmitting a torque to discharge sprocket gear 32 provided coaxially with discharge sprocket 8 which discharges carrier tape 20. Fifth transmission gear 37 meshes with transport sprocket gear 34. Fifth transmission gear 37 meshes with sixth transmission gear 38 that transmits a torque to peeling-off roller gear 36 provided coaxially with driving roller 21. Therefore, the torque of positioning sprocket gear 31 is transmitted to driving roller 21 and driven roller 22 which are the pair of rollers for tape-feeding cover tape 20a peeled off from carrier tape 20 by fifth transmission gear 37, sixth transmission gear 38, and peeling-off roller gear 36.

In the above configuration, by driving first motor 5 to generate the torque, the torque is transmitted to positioning sprocket gear 31, discharge sprocket gear 32, transport sprocket gear 34, and peeling-off roller gear 36 via a plurality of gears. Therefore, the torque is transmitted to positioning sprocket 7, discharge sprocket 8, transport sprocket 6, and driving roller 21 provided coaxially with positioning sprocket gear 31, discharge sprocket gear 32, transport sprocket gear 34, and peeling-off roller gear 36.

That is, positioning sprocket 7 that is the first sprocket, discharge sprocket 8 that is the second sprocket, transport sprocket 6 that is the third sprocket, and driving roller 21 for discharging cover tape 20a are driven by first motor 5 that is a common driving source. By sharing the driving source in this way, driving roller 21 and driven roller 22 for discharging cover tape 20a can be disposed at a position close to component pickup position 4c, and a configuration which is suitable for the use of short tape 201 can be realized.

Figure 9:
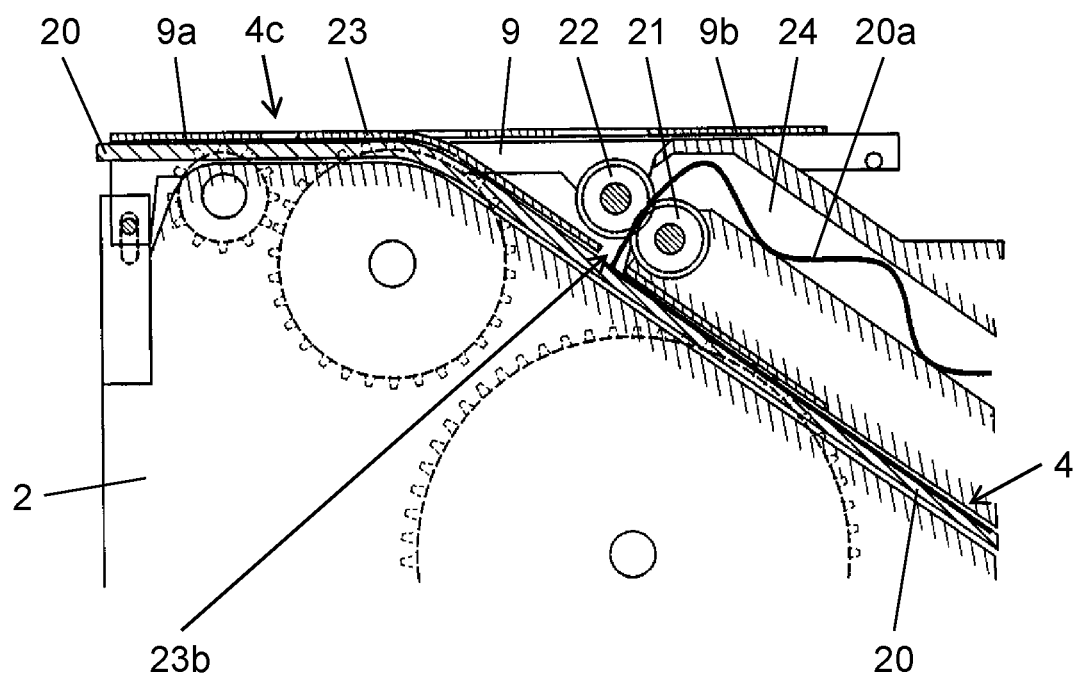
FIG. 9 is a functional explanatory view of the component supply device of the exemplary embodiment of the present disclosure.

FIG. 9 illustrates a state where carrier tape 20 is set in the automatic loading mode in which carrier tape 20 is automatically loaded. The tip portion of cover tape 20a is introduced between driving roller 21 and driven roller 22 via opening portion 23b by air injection. By rotating these rollers in this state, cover tape 20a is sandwiched and peeled off from carrier tape 20. Peeled-off cover tape 20a is discharged to cover tape storage unit 2f (see FIG. 2) via cover tape discharge path 24.

Figure 10:
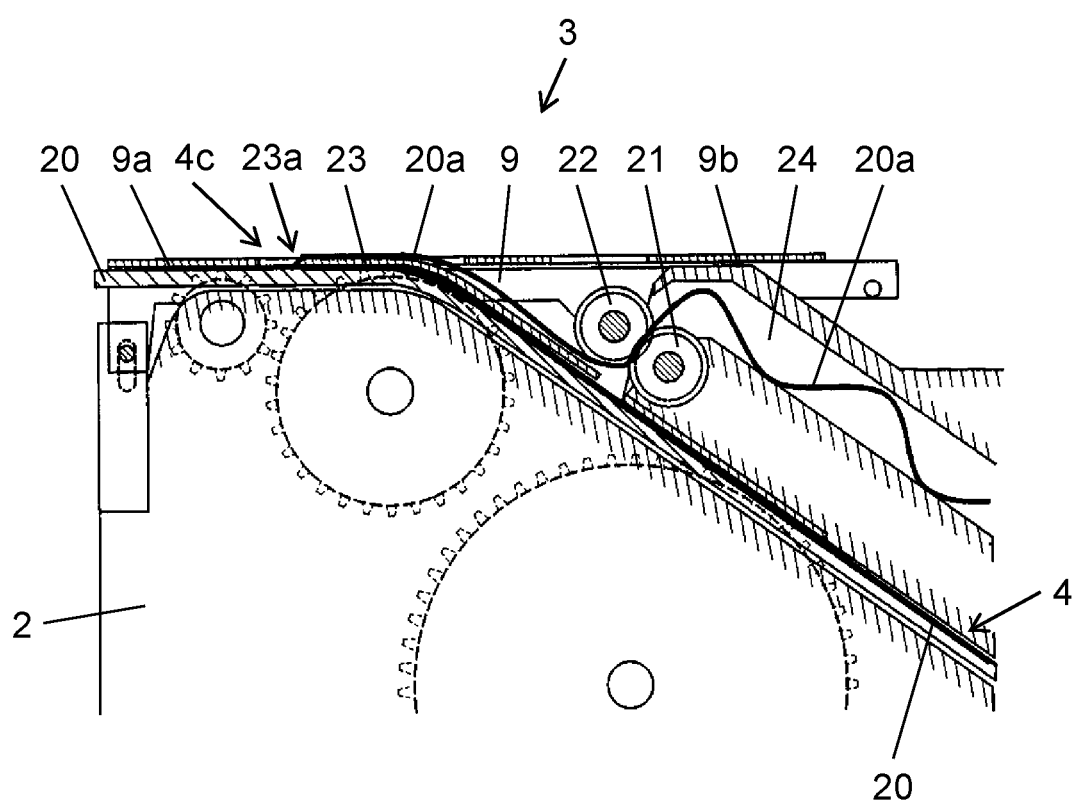
FIG. 10 is a functional explanatory view of the component supply device of the exemplary embodiment of the present disclosure.

FIG. 10 illustrates a state where carrier tape 20 is manually set. The present exemplary embodiment is applied to a case where leading carrier tape 20 is set in the splicing mode in which a plurality of carrier tapes 20 connected by splicing are continuously supplied. In this case, in a state where opening/closing cover 9 is opened (see FIG. 7), leading carrier tape 20 is transported along tape transport path 4, and the tip portion reaches the downstream side of peeler 23a of tape guide 23.

Next, in this state, cover tape 20a is manually peeled off from carrier tape 20, and peeler 23a is folded back and guided to cover tape discharge path 24. By closing opening/closing cover 9 in this state, cover tape 20a is in a sandwiched state between driving roller 21 and driven roller 22. Therefore, cover tape 20a can be peeled off from carrier tape 20 by these rollers and discharged to cover tape storage unit 2f.

Figure 11:
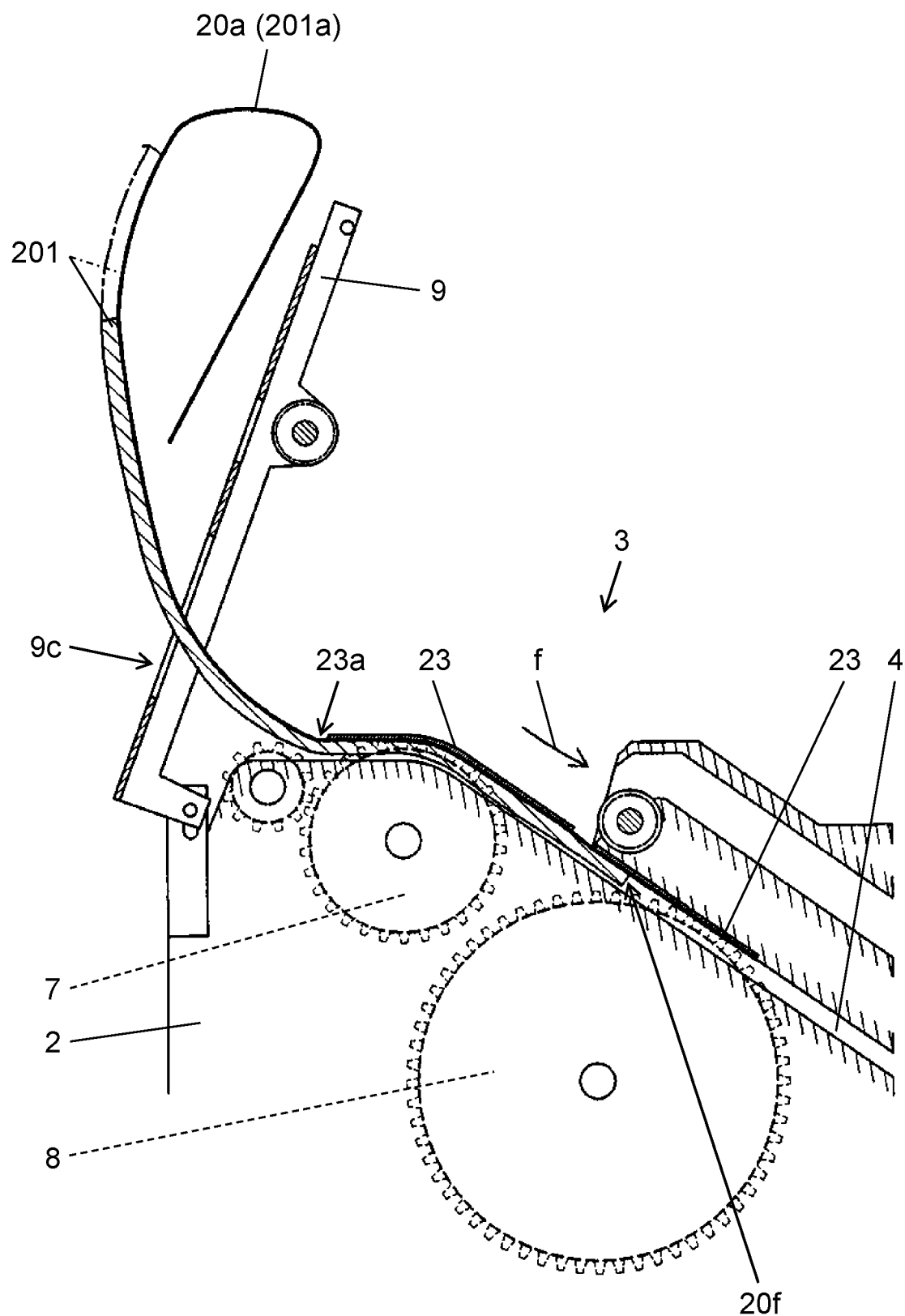
FIG. 11 is an explanatory view of a procedure of loading work of a short tape in the component supply device of the exemplary embodiment of the present disclosure.
Figure 12:
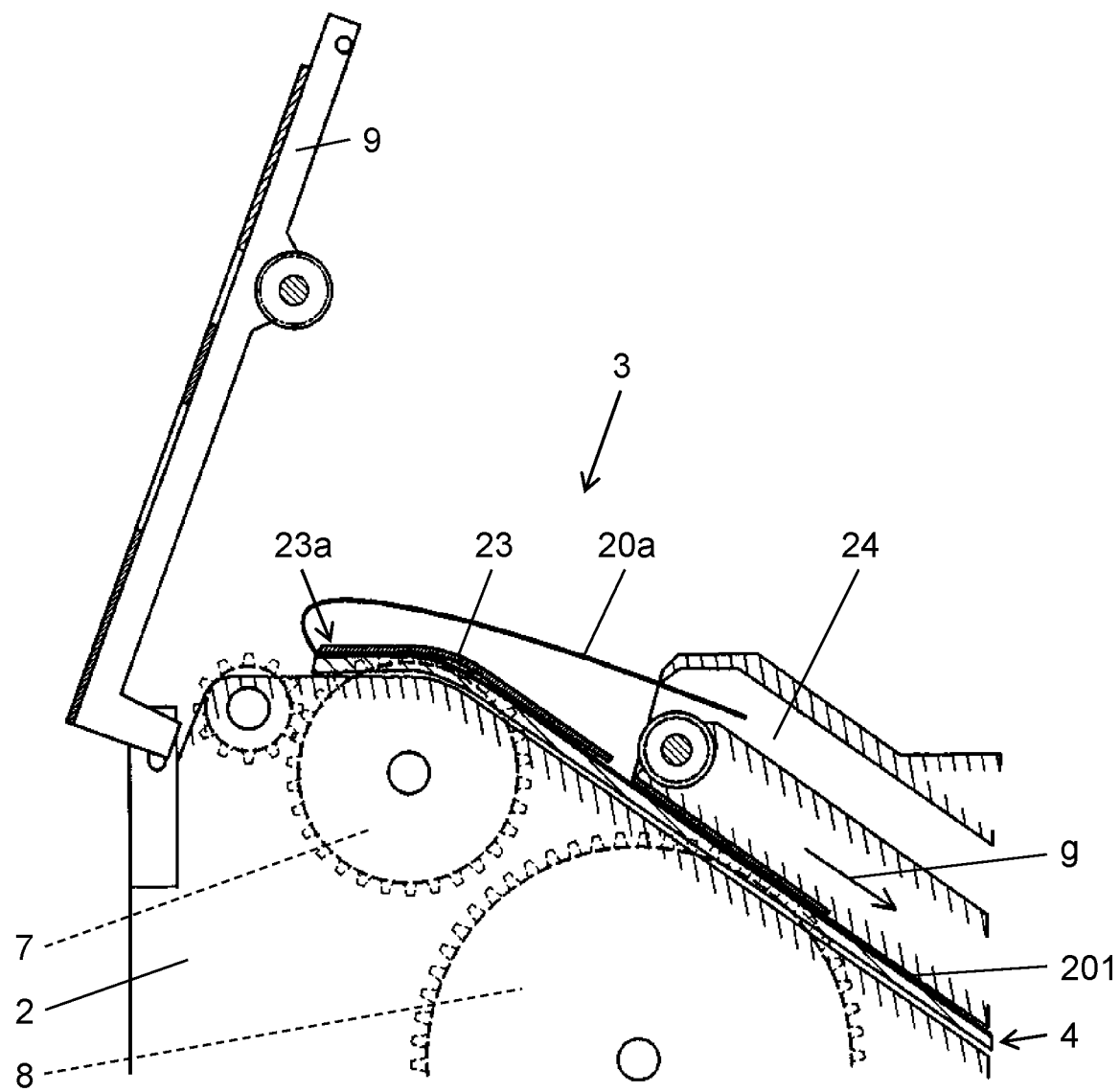
FIG. 12 is an explanatory view of a procedure of loading work of the short tape in the component supply device of the exemplary embodiment of the present disclosure.
Figure 13:
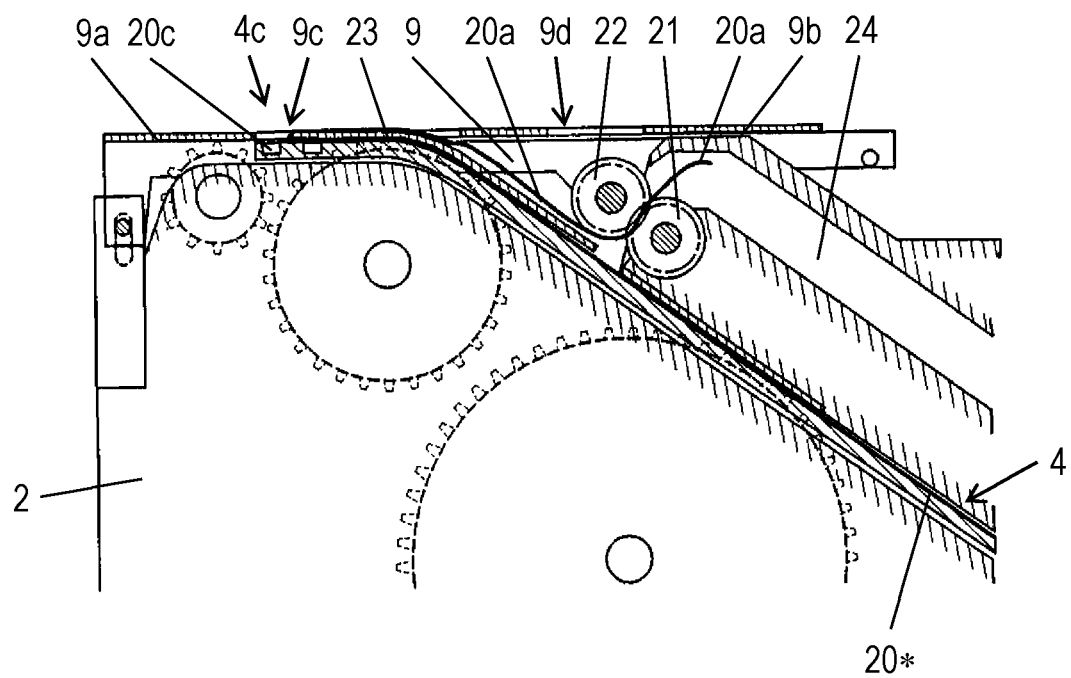
FIG. 13 is an explanatory view of a procedure of loading work of the short tape in the component supply device of the exemplary embodiment of the present disclosure.

FIGS. 11, 12, and 13 illustrate loading work of short tape 201, in which carrier tape 20 is cut into short pieces, into tape feeder 1. As illustrated in FIG. 25, short tape 201 that is the work target is a short tape cut into an atypical tape length TL. Prior to the loading work, short tape 201 is pretreated for peeling off cover tape 20a.

Only the base tape portion of the tip portion of short tape 201 is cut off so that the tip portion of cover tape 20a to be peeled off can be guided to the upstream side and sandwiched between driving roller 21 and driven roller 22 (See FIG. 11), or additional dummy tape 201a is added to the tip portion of cover tape 20a (see FIG. 25) to secure a required length for guiding cover tape 20a to the upstream side. In the loading work of short tape 201, as illustrated in FIG. 11, first, rear end portion 20f of short tape 201 passing through first opening portion 9c of opening/closing cover 9 from the upper surface side is inserted into the upstream side from a gap between peeler 23a that is the edge on the downstream side of tape guide 23 and tape transport path 4 (arrow f). That is, in the present exemplary embodiment, the opening portion where peeler 23a is located in tape transport path 4 is a short tape loading port into which short tape 201 is inserted.

After that, as illustrated in FIG. 12, short tape 201 is inserted further into the upstream side (arrow g), and the tip portion of short tape 201 from which cover tape 20a is peeled off substantially matches with the position of peeler 23a. When short tape 201 is loaded, feed hole 20c engages with positioning sprocket 7, engagement pin 7a of discharge sprocket 8, and engagement pin 8a. Next, the tip portion of folded cover tape 20a is inserted into cover tape discharge path 24.

Next, as illustrated in FIG. 13, opening/closing cover 9 is closed and cover tape 20a is pushed down by driven roller 22. Therefore, cover tape 20a is sandwiched between driving roller 21 and driven roller 22, and cover tape 20a can be discharged into cover tape discharge path 24. At this time, the position of short tape 201 is manually adjusted, and heading work is performed so that feed hole 20c at the leading portion matches with component pickup position 4c.

At the same time, slack of cover tape 20a is removed. Since cover tape 20a has poor rigidity and is easily bent, cover tape 20a tends to be in a loosened state on the downstream side of driven roller 22 when opening/closing cover 9 is closed. In such a case, driven roller 22 is manually rotated in a slack removing direction by a finger or a work tool through second opening portion 9d provided in opening/closing cover 9, and the slack state of cover tape 20a is adjusted.

That is, in the present exemplary embodiment, a configuration is provided in which driving roller 21 and driven roller 22 which are the pair of rollers are disposed below opening/closing cover 9, and second opening portion 9d is formed in opening/closing cover 9 for allowing access to at least one of driving roller 21 and driven roller 22. With this configuration, even in a state where the opening/closing cover 9 is closed, driving roller 21 and driven roller 22 disposed below the opening/closing cover 9 can be adjusted to easily remove the slack of cover tape 20a.

Figure 14:
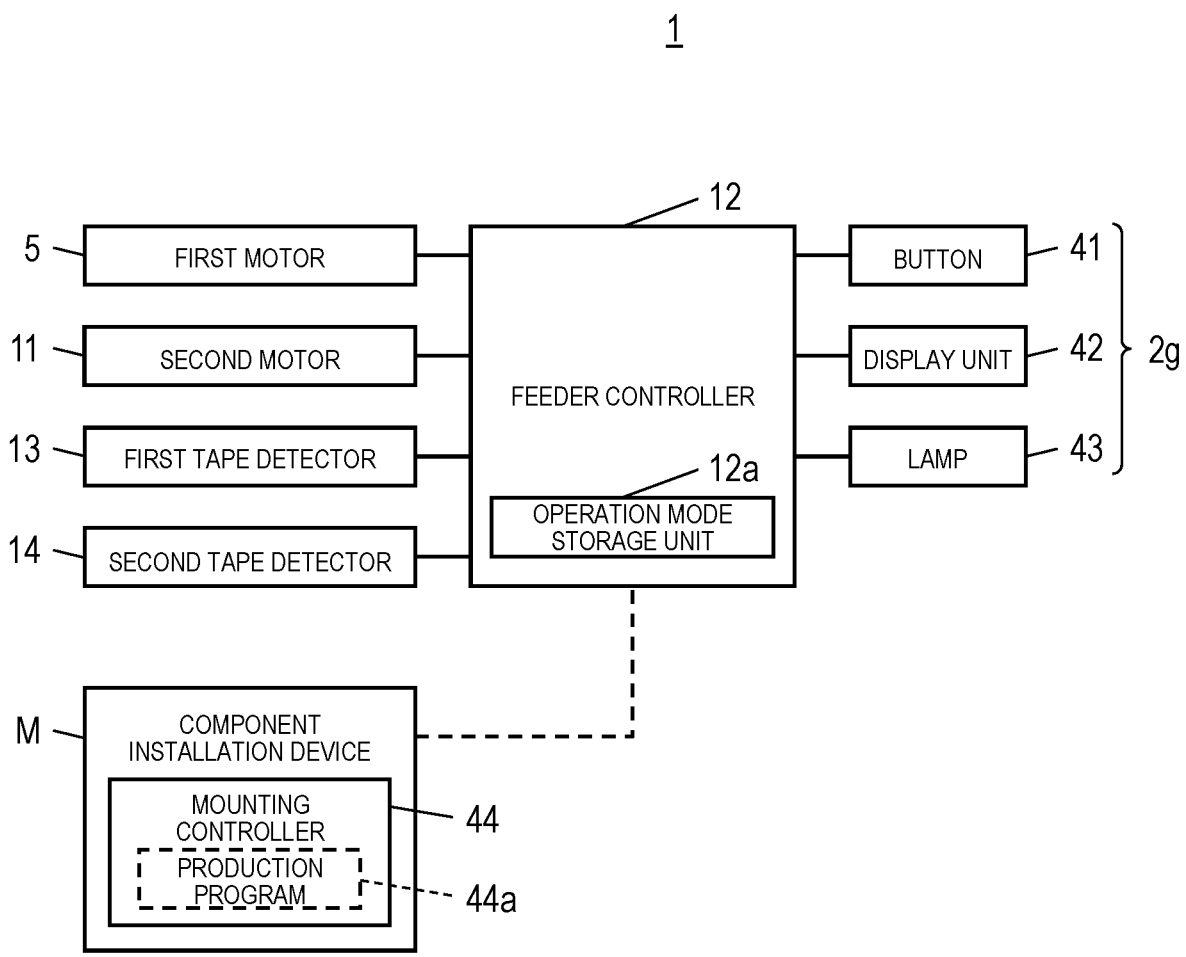
FIG. 14 is a block diagram illustrating a configuration of a control system of the component supply device of the exemplary embodiment of the present disclosure.

A configuration of the control system of tape feeder 1 will be described with reference to FIG. 14. In FIG. 14, tape feeder 1 includes feeder controller 12 (controller) that controls each portion constituting tape feeder 1. That is, feeder controller 12 is connected to first motor 5 and second motor 11 to control them. Therefore, operations of first carrier tape transporter 15 and second carrier tape transporter 16 are controlled.

Feeder controller 12 is connected to first tape detector 13 and second tape detector 14 to receive detection signals thereof. The operation controls of first carrier tape transporter 15 and second carrier tape transporter 16 are executed based on these detection signals. Feeder controller 12 is connected to button 41, display unit 42, and lamp 43 provided on operation panel 2g.

By operating button 41 to input a predetermined operation to feeder controller 12, an operation command is performed to first carrier tape transporter 15 and second carrier tape transporter 16 in tape feeder 1. Display unit 42 displays an operation state of tape feeder 1 and the like in accordance with a command from feeder controller 12. Lamp 43 lights up in accordance with a command from feeder controller 12 to perform notification of an abnormality alarm or the like.

In the control by feeder controller 12 described above, feeder controller 12 operates first carrier tape transporter 15 and second carrier tape transporter 16 in one operation mode selected from a plurality of (three in this case) operation modes. Feeder controller 12 includes operation mode storage unit 12a, and operation mode storage unit 12a stores information for specifying the selected operation mode which is described above. In other words, operation mode storage unit 12a is a storage unit that stores information for specifying the operation mode set in tape feeder 1.

In a state where tape feeder 1 is set in component installation device M, feeder controller 12 is connected to mounting controller 44 of component installation device M. Production program 44a is stored in the storage unit included in mounting controller 44. Production program 44a includes information for specifying the installation position (slot number) of tape feeder 1 in component supplier 104 and the operation mode of tape feeder 1 installed at the installation position. That is, the storage unit included in mounting controller 44 is also a storage unit that stores information regarding the operation mode of tape feeder 1.

When tape feeder 1 is set in component installation device M, feeder controller 12 can communicate with component installation device M, and can send and receive control signals between feeder controller 12 and mounting controller 44. Therefore, component installation device M is in an accessible state to operation mode storage unit 12a of feeder controller 12.

Tape feeder 1 operates in a set operation mode. Feeder controller 12 controls first carrier tape transporter 15 and second carrier tape transporter 16 based on the information for specifying the operation mode of operation mode storage unit 12a, and performs notification to component installation device M. Therefore, the tape transport operation according to the selected operation mode is executed. On the other hand, component installation device M performs a process based on the operation mode of tape feeder 1 and transmits a command for operating tape feeder 1.

There are a method for setting by operating button 41 connected to feeder controller 12 in an operation unit of tape feeder 1 and a method for setting by using the function of component installation device M to set (select the operation mode) the operation mode of tape feeder 1. As the method for setting by component installation device M, there are a method for performing the setting via an operation screen included in component installation device M and a method for setting based on production program 44a prepared in advance as production execution data.

In a case where the operation mode is set by the operation of button 41, feeder controller 12 is changed to the operation setting mode by the operation of button 41, and the numbers and characters indicating the operation mode displayed on display unit 42 are switched by button 41 to select. By this operation, operation mode storage unit 12a stores information for specifying the operation mode. With the method for setting the operation mode with tape feeder 1 in this way, the operation mode of tape feeder 1 can be set at a stage of so-called "external set-up" before installation on planned component installation device M.

In a case where tape feeder 1 of which the operation mode is set by button 41 is installed in component installation device M, it is confirmed by component installation device M whether the operation mode of installed tape feeder 1 matches the operation mode defined in advance in production program 44a. Therefore, it is possible to detect by an operator an operation mode setting error or an error in an installation position of tape feeder 1 in component supplier 104 before starting component installation work and notify the operator of the fact.

In a case where component installation device M sets the operation mode based on production program 44a, mounting controller 44 writes the information for specifying the operation mode included in production program 44a in operation mode storage unit 12a of tape feeder 1 before the start of operation or after tape feeder 1 is installed in component installation device M. More specifically, the information for specifying the operation mode and the slot number are read from production program 44a, and the operation mode is written in operation mode storage unit 12a of tape feeder 1 installed in a slot specified by the slot number. This makes it possible to set the operation mode of tape feeder 1 without the intervention of the operator, and prevent loss due to a mismatch between the operation mode in the production program and the operation mode of tape feeder 1 installed in component supplier 104.

In the present exemplary embodiment, feeder controller 12 having the above-described configuration controls each portion of tape feeder 1, and thereby a plurality (here, three) of different operation modes described below are realized. First, an automatic loading mode (first operation mode) is a mode in which a plurality of carrier tapes 20 are sequentially supplied to tape feeder 1 without splicing. In this automatic loading mode, a detection result of first tape detector 13 which is the carrier tape detector is used to control first carrier tape transporter 15 and second carrier tape transporter 16 to allow succeeding carrier tape 20 to follow preceding carrier tape 20 to transport to component pickup position 4c.

In this case, the connecting portion detection function by second tape detector 14 which is the connecting portion detector is invalid. While first tape detector 13 detects carrier tape 20, carrier tape 20 is transported by pitch-feeding by first carrier tape transporter 15 and storage portions 20b of carrier tape 20 are sequentially stopped at component pickup position 4c. When first tape detector 13 does not detect preceding carrier tape 20, following the transport of preceding carrier tape 20 by first carrier tape transporter 15, succeeding carrier tape 20 is transported by second carrier tape transporter 16.

That is, in the automatic loading mode, in a state where preceding carrier tape 20 and succeeding carrier tape 20 are not connected, succeeding carrier tape 20 following preceding carrier tape 20 is fed to component pickup position 4c and thereby the component stored in storage portion 20b of carrier tape 20 can be supplied to component installation device M.

Next, a splicing mode (second operation mode) is a mode in which preceding and succeeding carrier tapes 20 are connected by splicing and continuously supplied to tape feeder 1. In this splicing mode, carrier tape 20 is transported to component pickup position 4c by the pitch-feeding by first carrier tape transporter 15. In this splicing mode, the connecting portion detection function by second tape detector 14 is valid, and if the connecting portion is detected in the process of transport of carrier tape 20, component installation device M is notified to that effect.

Second carrier tape transporter 16 may be valid or invalid. In a case where it is valid, only in a case where leading carrier tape 20 is inserted into insertion port 4a, the operation is performed. In the process of the pitch-feeding of carrier tape 20 by first carrier tape transporter 15, when first tape detector 13 does not detect carrier tape 20, the transport is stopped and component installation device M is notified that the tape runs out.

A short tape mode (third operation mode) is a mode in which short tape 201 illustrated in FIG. 25 is the supply target. In the short tape mode, short tape 201 is transported by the pitch-feeding by first carrier tape transporter 15. In this short tape mode, both the carrier tape detection function by first tape detector 13 and the connecting portion detection function by second tape detector 14 are invalid. First carrier tape transporter 15 performs the pitch-feeding of short tape 201 regardless of whether carrier tape 20 is detected by first tape detector 13. That is, in the third operation mode, feeder controller 12 controls first carrier tape transporter 15 by ignoring a detection result of the detector described above.

The plurality of operation modes described above include the automatic loading mode (first operation mode) and the splicing mode (second operation mode). These operation modes are configured to include the following notifications that notify component installation device M of that effect at the timing when first tape detector 13 and second tape detector 14, which are respectively the detector, detect predetermined detection targets. Upon receiving these notifications, component installation device M executes a predetermined process according to a content of each notification.

That is, the automatic loading mode (first operation mode) includes a first notification that is notified to component installation device M when first tape detector 13 which is the detector detects the passage of the rear end of preceding carrier tape 20, and a second notification that is notified to component installation device M when the component stored in succeeding carrier tape 20 following preceding carrier tape 20 is stopped at component pickup position 4c.

The splicing mode (second operation mode) includes a third notification that is notified to component installation device M when first tape detector 13 which is the detector detects the passage of the rear end of carrier tape 20, and a fourth notification that is notified to component installation device M when second tape detector 14 which is the detector detects the connecting portion.

Figure 15:
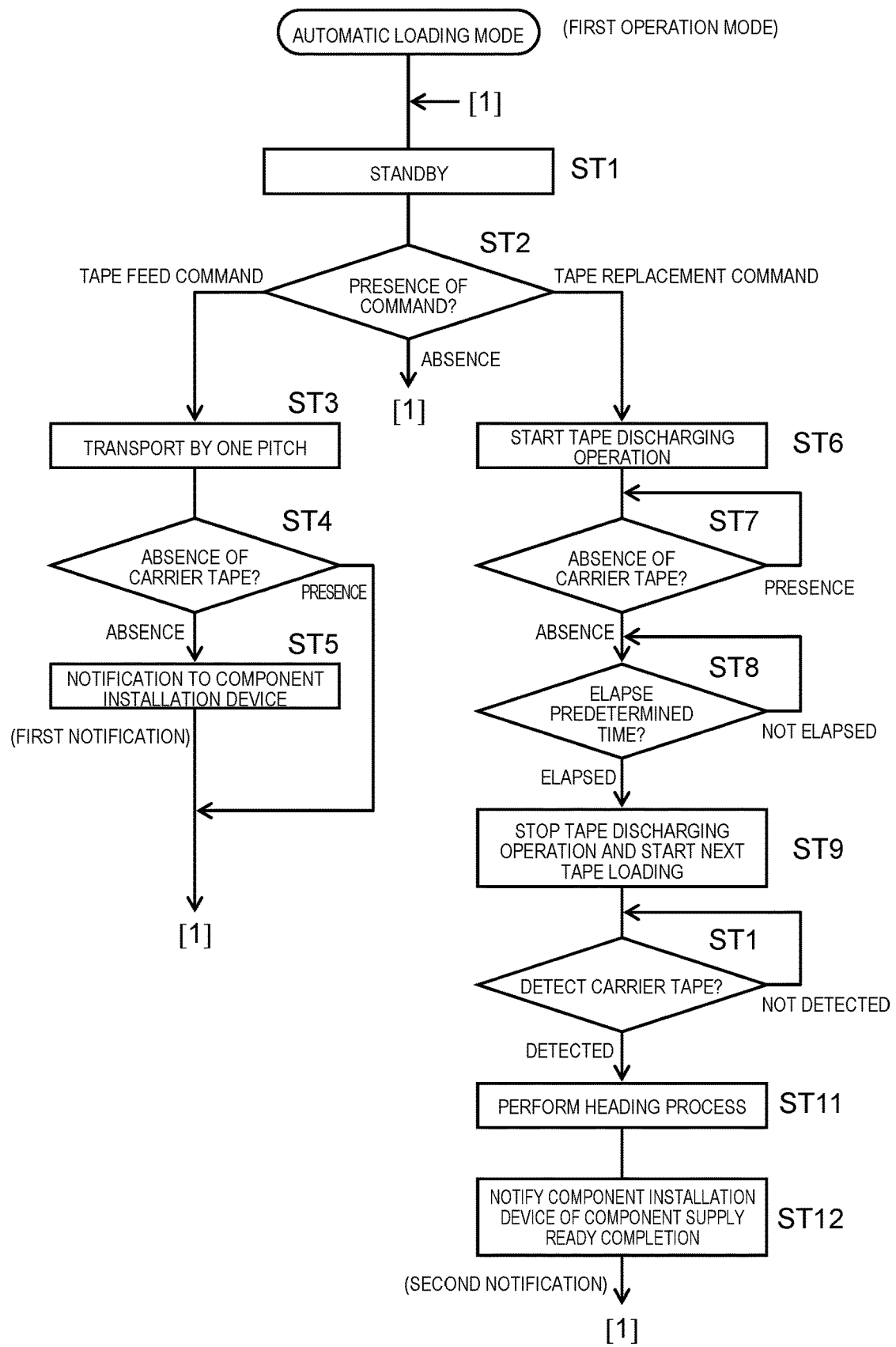
FIG. 15 is a flowchart of a tape transport process in an automatic loading mode in the component supply device of the exemplary embodiment of the present disclosure.

Next, a process flow in the above-described automatic loading mode (first operation mode) will be described with reference to FIG. 15. First, tape feeder 1 is in a standby state waiting for an operation command from component installation device M (ST1), and monitors the presence or absence of the command in this state (ST2). If there is no command, the process returns to (ST1) and the standby is continued. In (ST2), in a case where the tape feed command is received from component installation device M, first carrier tape transporter 15 is operated to transport carrier tape 20 by one pitch (ST3).

Next, the presence or absence of carrier tape 20 is determined from a detection result of first tape detector 13 (ST4). In a case where there is carrier tape 20, the process returns to (ST1) and waits for the next command. In a case where there is no carrier tape 20, component installation device M is notified to that effect (first notification) (ST5). That is, when first tape detector 13 detects the passage of the rear end of preceding carrier tape 20, component installation device M is notified to that effect. This first notification is a notification that preceding carrier tape 20 is exhausted. The process of component installation device M that has received the first notification will be described later.

In a case where a tape replacement command is received from component installation device M in (ST2), a tape discharging operation is started (ST6). That is, at that time, carrier tape 20 that is the transport target of first carrier tape transporter 15 is discharged from discharge port 4b by continuous transport. The presence or absence of carrier tape 20 is monitored by first tape detector 13, it is confirmed that carrier tape 20 is not present, and then it monitors further whether a predetermined time has elapsed (ST8).

Carrier tape 20 is surely discharged from tape transport path 4 by waiting for the elapse of a predetermined time after first tape detector 13 does not detect carrier tape 20. That is, by waiting an elapse of a "predetermined time" that is several seconds longer than the time required for the rear end of carrier tape 20 to be discharged from the discharge port 4b after passing through the detection position of first tape detector 13 by the continuous transport, carrier tape 20 is surely discharged before a heading process is started. After confirming the elapse of the predetermined time in (ST8), the tape discharging operation by first carrier tape transporter 15 is stopped, and the loading of next carrier tape 20 is started (ST9). That is, next carrier tape 20 is inserted from insertion port 4a, and is tape-fed to the downstream side by continuous transport along tape transport path 4 by second carrier tape transporter 16.

Next, in this tape feeding, it is monitored whether carrier tape 20 is detected (ST10). The tape detection is performed by detecting the tip of next carrier tape 20 by first tape detector 13. If the detection of carrier tape 20 is confirmed in (ST10), a heading process is performed (ST11). That is, the position of carrier tape 20 is adjusted so that storage portion 20b of the head of carrier tape 20 stops at component pickup position 4c. In the present exemplary embodiment, the loading of carrier tape 20 next to ST9 is performed after the "predetermined time" has elapsed in ST8, but ST8 may be omitted and the discharge of preceding carrier tape 20, and the tape feeding and the heading process of next carrier tape 20 may be performed simultaneously. Since a distance of tape transport path 4 from first tape detector 13 to component pickup position 4c is known, feeder controller 12 uses the timing when first tape detector 13 detects the tip of carrier tape 20 to control a driving time or a feeding amount of first carrier tape transporter 15 to stop storage portion 20b of the head of carrier tape 20 at component pickup position 4c.

That is, in the automatic loading mode that is the first operation mode, in a case where succeeding carrier tape 20 following preceding carrier tape 20 is fed to component pickup position 4c by the tape replacement command from component installation device M, first, the passage of the rear end of preceding carrier tape 20 and the passage of the tip of succeeding carrier tape 20 are detected by first tape detector 13 as the detector. After that, the position of carrier tape 20 is adjusted so that component P stored in succeeding carrier tape 20 is stopped at component pickup position 4c.

Thereafter, component installation device M is notified of component supply ready completion (second notification) (ST12). That is, when the component stored in succeeding carrier tape 20 following preceding carrier tape 20 is stopped at component pickup position 4c, component installation device M is notified to that effect. Upon receiving this notification, component installation device M updates data related to the component, and issues a tape feed command to tape feeder 1 at timing instructed by an installation program. The updated data includes the remaining number of components of carrier tape 20, as well as component identification information, lot information, manufacturer information, and the like used as production history information.

Figure 16:
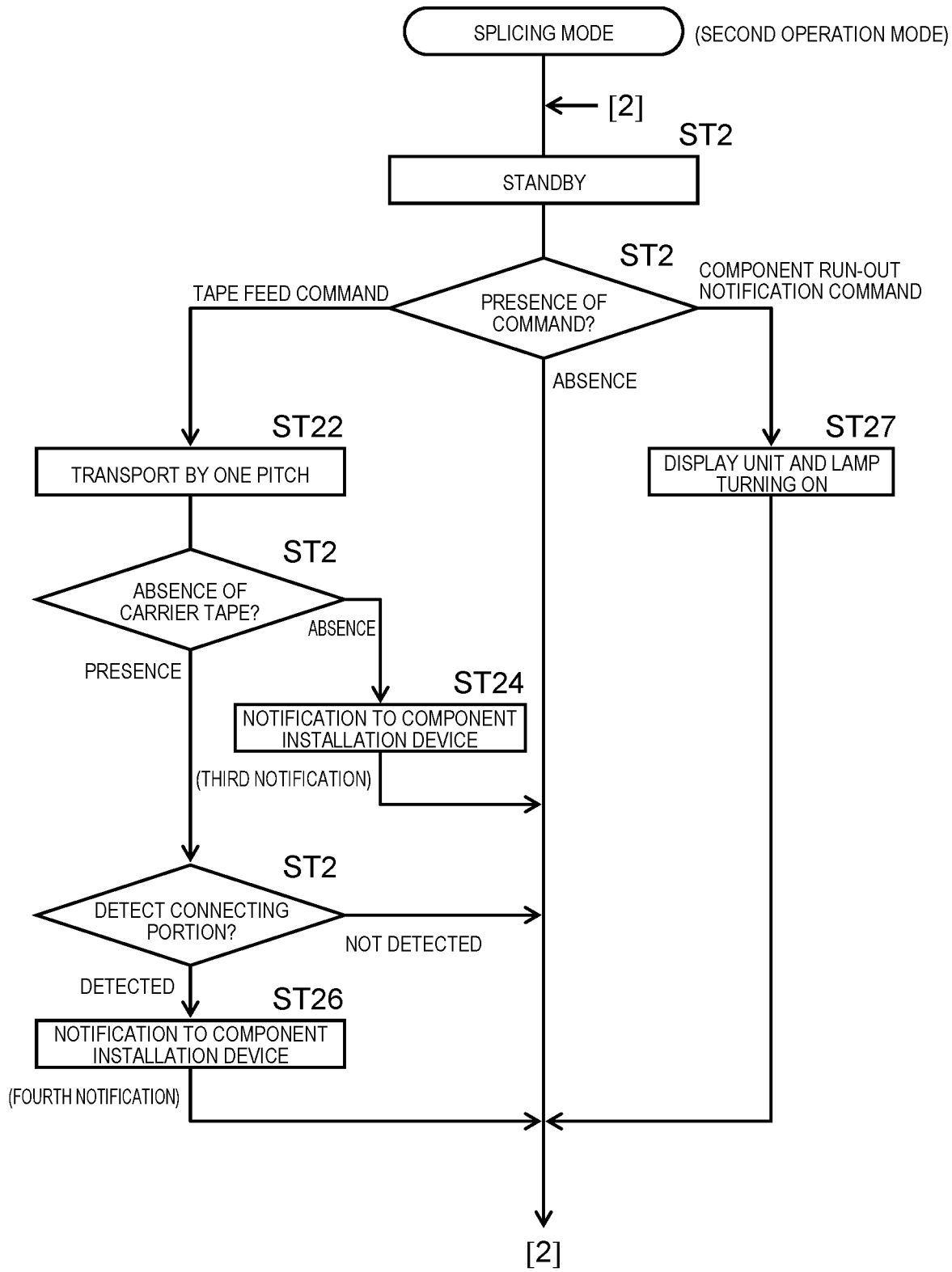
FIG. 16 is a flowchart of a tape transport process in a splicing mode in the component supply device of the exemplary embodiment of the present disclosure.

Next, a process flow in the above-described splicing mode (second operation mode) will be described with reference to FIG. 16. First, tape feeder 1 is in a standby state waiting for an operation command from component installation device M (ST20), and monitors the presence or absence of the command in this state (ST21). If there is no command, the process returns to (ST20) and the standby is continued. In (ST21), in a case where the tape feed command is received from component installation device M, first carrier tape transporter 15 is operated to transport carrier tape 20 by one pitch (ST22).

Next, the presence or absence of carrier tape 20 is determined from the detection result of first tape detector 13 (ST23). In a case where there is no carrier tape 20, component installation device M is notified to that effect (third notification) (ST24). When first tape detector 13 that is the detector (carrier tape detector) does not detect carrier tape 20 and detects the passage of the rear end of carrier tape 20, component installation device M is notified to that effect, and the process returns to (ST20) and waits for the next command. This third notification is a notification that carrier tape 20 is absent, that is, the component is run out. A process of component installation device M that has received the third notification will be described later.

Component installation device M, which has received the third notification (notification that there is no carrier tape 20) in (ST24), executes a process (FIG. 19) of a case where the notification that there is no carrier tape 20, which will be described later, is received. That is, component installation device M notifies the operator of the occurrence of component run-out by the notification means of component installation device M, and issues the component run-out notification command to tape feeder 1. Therefore, in operation panel 2g of tape feeder 1, the component run-out notification is notified by display by display unit 42 or lighting of lamp 43. In a case of the splicing mode, if carrier tape 20 is normally replenished, a situation of the component run-out does not occur, but in a case where splicing is abnormal due to human error, the component run-out may occur.

In a case where it is determined in (ST23) that there is carrier tape 20, the presence or absence of detection of the connecting portion is determined by second tape detector 14 that is the detector (connecting portion detector) (ST25). If the connecting portion is not detected, the process returns to (ST20) to continue the standby, and in a case where the connecting portion is detected, component installation device M is notified to that effect (fourth notification) (ST26). That is, when second tape detector 14 that is the detector detects the connecting portion, component installation device M is notified to that effect (fourth notification).

This fourth notification is a notification that the connecting portion will soon pass component pickup position 4c, that is, a notification that carrier tape 20 will be switched. Upon receiving the fourth notification, component installation device M executes a process (FIG. 20) of a case where the connecting portion detection notification described later is received.

Figure 17:
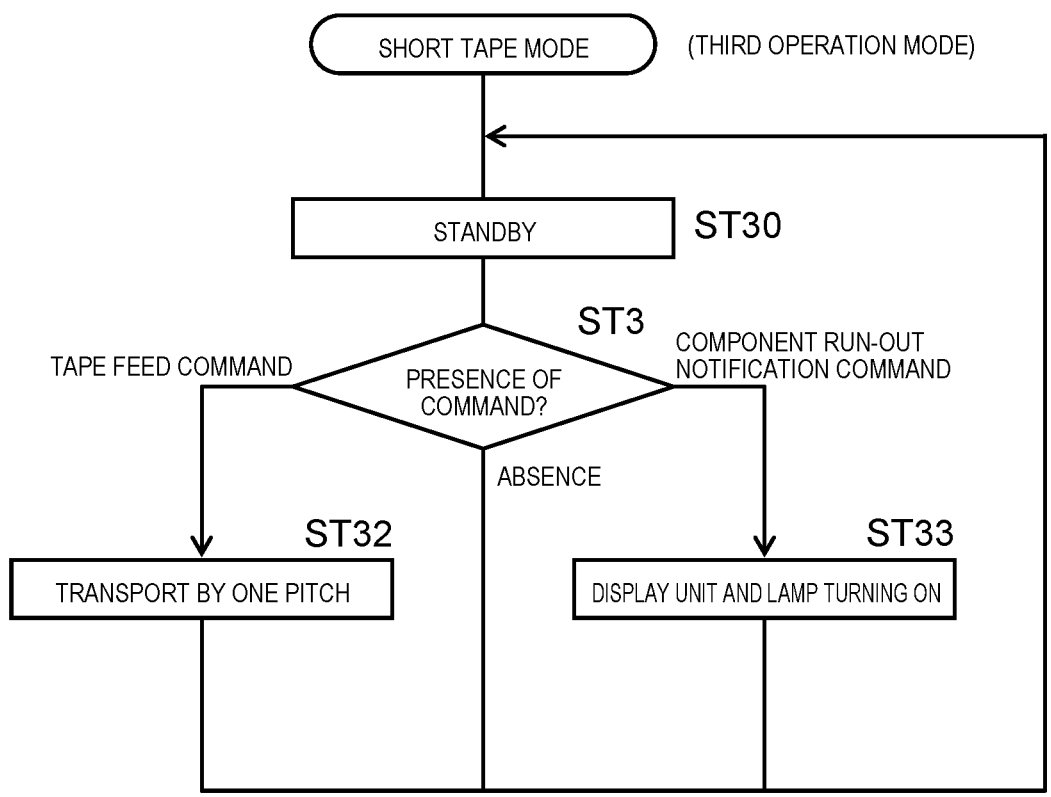
FIG. 17 is a flowchart of a tape transport process in a short tape mode in the component supply device of the exemplary embodiment of the present disclosure.

Next, a process flow in the short tape mode (third operation mode) described above will be described with reference to FIG. 17. In this third operation mode, feeder controller 12 ignores actual detection results of first tape detector 13 and second tape detector 14 which are the detector, and controls first carrier tape transporter 15.

First, tape feeder 1 is in a standby state waiting for an operation command from component installation device M (ST30), and monitors the presence or absence of the command in this state (ST31). If there is no command, the process returns to (ST30) and the standby is continued. In a case where the tape feed command is received from component installation device M in (ST31), first carrier tape transporter 15 is operated to transport carrier tape 20 by one pitch (ST32), and then the process returns to (ST30) and the standby is continued. In a case where there is the component run-out notification command in (ST31), the display by display unit 42 or turning-on of lamp 43 is performed (ST33) to notify the operator that the component runs out, and then the process returns to (ST30) and waits.

In tape feeder 1 illustrated in the present exemplary embodiment, any of the above-mentioned first operation mode, second operation mode, and third operation mode can be selectively executed. That is, in the case of the automatic loading mode (first operation mode) in which preceding carrier tape 20 and succeeding carrier tape 20 are fed to component pickup position 4c without being connected, feeder controller 12 uses the detection result of first tape detector 13 that is the detector (carrier tape detector) to perform the first notification and the second notification described above. Upon receiving these notifications, feeder controller 12 of component installation device M controls first carrier tape transporter 15 and second carrier tape transporter 16.

In a case of the splicing mode (second operation mode) in which preceding carrier tape 20 and succeeding carrier tape 20 are connected and fed, feeder controller 12 uses the detection result of the first tape detector 13 that is the detector (carrier tape detector) to perform the third notification described above and control first carrier tape transporter 15. At the same time, when second tape detector 14 that is the detector (connecting portion detector) detects the connecting portion between preceding carrier tape 20 and succeeding carrier tape 20, the fourth notification is performed and component installation device M is notified to that effect. Upon receiving this notification, component installation device M executes a process described with reference to FIG. 16.

Next, referring to FIG. 18, the component run-out process in component installation device M will be described. This process relates to a process executed in a case where the component run-out is detected by the component run-out detection function provided in component installation device M in the process of executing the component installation work by component installation device M. Component installation device M constantly monitors the presence or absence of the component run-out (ST40). For example, in a case where a component pickup error occurs continuously for a specified number of times or more in the component pickup from the target tape feeder 1, component installation device M determines that the component has run out.

When the occurrence of the component run-out is detected, the operation mode of the target tape feeder 1 is determined. The determination of the operation mode is performed by referring to the information for specifying the operation mode stored in operation mode storage unit 12a of feeder controller 12. That is, by referring to operation mode storage unit 12a, it is determined whether the operation mode of tape feeder 1 is the automatic loading mode (first operation mode) illustrated in FIG. 15 (ST41). In a case of "No" and the mode is not the automatic loading mode, the notification function of component installation device M notifies tape feeder 1 of the occurrence of the component run-out (ST42). At the same time, a component run-out notification command is issued to tape feeder 1 (ST43). Therefore, tape feeder 1 that receives this command notifies display unit 42 or the like provided on tape feeder 1 of the component run-out.

In a case of "Yes" and the mode being the automatic loading mode in (ST41), a tape replacement command is issued to tape feeder 1 (ST44). It is confirmed whether a countdown flag is turned ON (ST45). The countdown flag is a flag for enabling or disabling a counter that counts the number of times the tape feed command is issued to tape feeder 1. This counter will be described later. If the countdown flag is turned ON, count value K is set to a preset value for carrier tape 20 (ST46), and then the countdown flag is returned OFF (ST47). In a case where the countdown flag is already turned OFF in (ST45), (ST46) and (ST47) are skipped and the process proceeds to the next step.

The process waits until the second notification (ST12 in FIG. 15), which is a notification indicating that the component can be picked up from next carrier tape 20 from tape feeder 1, is received (ST48). When the loading (ST6 to ST11) of succeeding carrier tape 20 is completed in tape feeder 1 that has undergone the tape replacement process of ST44, component installation device M is notified of the second notification (ST12). Upon receiving this notification, component installation device M updates the component management information (ST49). The updated component management information includes the remaining number of components of carrier tape 20, as well as component identification information, lot information, manufacturer information, and the like used as production history information.

Next, referring to FIG. 19, a process in a case where component installation device M receives the notification that there is no carrier tape will be described. This process relates to a process executed in a case where component installation device M receives the notification that there is no carrier tape from tape feeder 1 in the process of executing the component installation work by component installation device M. The notification that there is no carrier tape corresponds to the notification (first notification) of ST5 in the automatic loading mode and ST24 (third notification) in the splicing mode. Component installation device M constantly monitors the presence or absence of notification that there is no carrier tape (ST50).

When the notification that there is no carrier tape is provided in ST50, the operation mode of target tape feeder 1 is determined. That is, by referring to operation mode storage unit 12a, it is determined whether the operation mode of tape feeder 1 is the automatic loading mode (first operation mode) illustrated in FIG. 15 (ST51). In a case of "No" and the mode being not the automatic loading mode, the notification that there is no carrier tape corresponds to the above-mentioned third notification. In this case, the component run-out notification that the component is run out is performed in tape feeder 1 by the notification function of component installation device M (ST52). At the same time, the component run-out notification command is issued to tape feeder 1 (ST53). Therefore, tape feeder 1 that receives this command notifies display unit 42 or the like provided on tape feeder 1 of the component run-out.

In the case of "Yes" and the mode being the automatic loading mode in (ST51), the notification that there is no carrier tape corresponds to the above-mentioned first notification. In this case, the countdown flag for tape feeder 1 is turned ON (ST54). When the countdown flag is turned ON, a counter for recording the remaining length of carrier tape 20 of which the end portion is detected by first tape detector 13 is effective. In the present exemplary embodiment, the remaining length is recorded by the number of tape feed commands issued by component installation device M, and the counter is subtracted each time the tape feed command is issued. A "set value" is given to this counter as an initial value. This "installation value" is the number of tape feed commands required to transport carrier tape 20 from the detection position of first tape detector 13 or the detection position of second tape detector 14 to component pickup position 4c, and corresponds to the length of tape transport path 4 from the detection position to component pickup position 4c.

Figure 20:
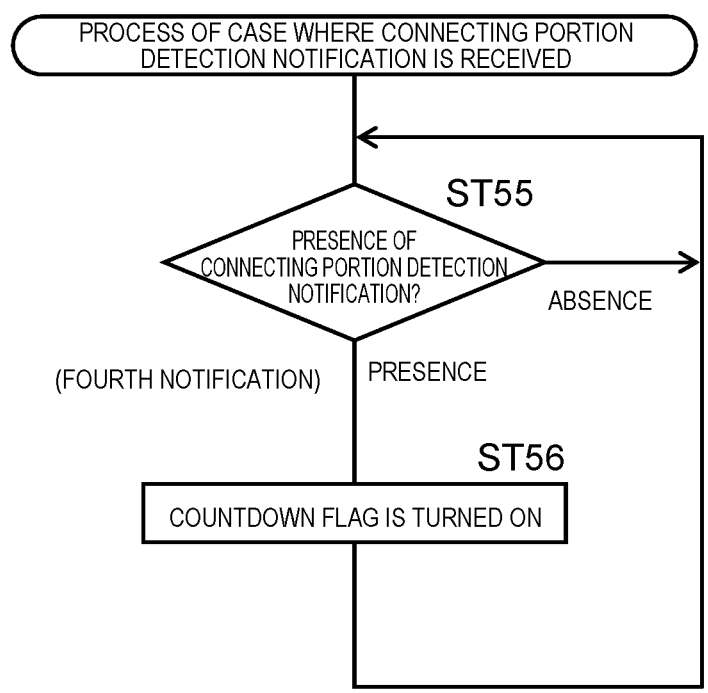
FIG. 20 is a flowchart of a process in a case where a connecting portion detection notification is received in the component supply device according to the exemplary embodiment of the present disclosure.

Next, referring to FIG. 20, a process in a case where component installation device M receives the connecting portion detection notification will be described. This process relates to a process executed in a case where the connecting portion detection notification is received from tape feeder 1 in operation in the splicing mode (second operation mode) in which component installation device M connects and feeds preceding carrier tape 20 and succeeding carrier tape 20, in the process of executing the component installation work by component installation device M. Component installation device M constantly monitors the presence or absence of the connecting portion detection notification (ST55). The connecting portion detection notification detected in (ST55) corresponds to the above-mentioned fourth notification. In this case, the countdown flag for tape feeder 1 is turned ON (ST56).

Next, referring to FIG. 21, a tape feeding process in component installation device M will be described. This process relates to a process when carrier tape 20 is tape-fed by first carrier tape transporter 15, in the process of executing the component installation work by component installation device M. The tape feeding process is executed while switching the target tape feeder 1 in the order specified in production program 44a. First, mounting controller 44 determines the operation mode of target tape feeder 1 of the tape feed command. That is, mounting controller 44 determines whether the operation mode of tape feeder 1 is the automatic loading mode (first operation mode) illustrated in FIG. 15 by referring to operation mode storage unit 12a (ST60). In a case of "No" and the mode being not the automatic loading mode, mounting controller 44 feeds the tape feed command to tape feeder 1 (ST61A). Tape feeder 1 that has received the tape feed command executes the process after ST22.

Next, mounting controller 44 determines whether the countdown flag is turned ON (ST62A). In a case where the countdown flag is turned ON, the countdown process of subtracting count value K (K=K−1) is executed (ST63A). In the countdown associated with this tape feed, it is sequentially determined whether count value K matches 0, that is, whether K=0 (ST64A). In a case where they do not match, the tape feeding process ends.

In a case where the operation mode is the splicing mode (second operation mode) and count value K matches 0 in ST64A, it means a state where the end of preceding carrier tape 20 passes through component pickup position 4*c* and component P stored in succeeding carrier tape 20 connected to preceding carrier tape 20 via the connecting portion has reached component pickup position 4*c*. Therefore, mounting controller 44 executes the component management information update when the target for picking up the component is switched from preceding carrier tape 20 to succeeding carrier tape 20 (ST65). Therefore, the remaining number of components of carrier tape 20, as well as component identification information, lot information, manufacturer information, and the like used as production history information is updated. Mounting controller 44 sets count value K for new carrier tape 20 to a predetermined set value (initial value) (ST66), turns OFF the countdown flag (ST67), and ends the tape feeding process.

In a case of "Yes" and the mode being the automatic loading mode in ST60, mounting controller 44 feeds the tape feed command to tape feeder 1 (ST61B). Subsequent process of ST62B to ST64B is the same as the process of ST62A to ST64A described above. In a case where the operation mode is the automatic loading mode (first operation mode) and count value K matches 0 in ST64B, it means a state where the end of preceding carrier tape 20 has passed component pickup position 4*c*. Therefore, mounting controller 44 feeds the tape replacement command to tape feeder 1 to discharge preceding carrier tape 20 and introduce succeeding carrier tape 20 (ST69). Mounting controller 44 sets count value K for new carrier tape 20 to a predetermined set value (initial value) (ST70), and turns OFF the countdown flag (ST71).

That is, in tape feeder 1 that has received the tape replacement command, the loading of succeeding carrier tape 20 (ST6 to ST11) is executed, and the second notification (ST12) is performed to component installation device M. During this time, mounting controller 44 waits until the second notification is received from tape feeder 1 that has fed the tape replacement command in (ST69) to notify that the component supply is ready (ST72). When mounting controller 44 receives the second notification, update of the component management information is performed (ST73) and ends the tape feeding process.

Although the above-described exemplary embodiment illustrates an example in which second tape detector 14 that is the connecting portion detector is provided, the connecting portion may be detected by first tape detector 13. That is, in this case, first tape detector 13 that is the carrier tape detector can detect carrier tape 20 passing through tape transport path 4 and the connecting portion between preceding carrier tape 20 and succeeding carrier tape 20. When first tape detector 13 detects the connecting portion between preceding carrier tape 20 and succeeding carrier tape 20, component installation device M is notified to that effect.

Figure 22:
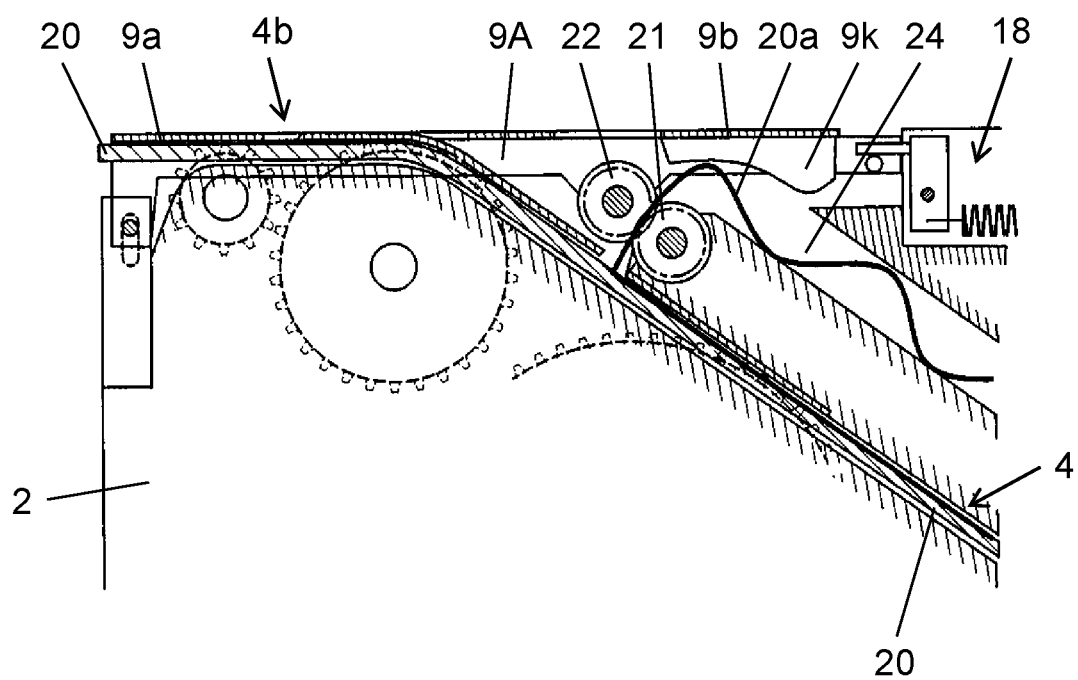
FIG. 22 is an explanatory view of a modified example of the opening/closing cover used in the component supply device of the exemplary embodiment of the present disclosure.

Next, opening/closing cover 9A of a modified example will be described with reference to FIGS. 22 to 24. FIG. 24 illustrates F-F cross section in FIG. 23. As illustrated in FIG. 22, opening/closing cover 9A has a configuration in which fins 9*k* are disposed on a lower surface side of second cover portion 9*b* in opening/closing covers 9 illustrated in FIGS. 1 to 13. Fin 9*k* is a cover tape guide, and provided in a shape that guides cover tape 20*a*, which is peeled off from carrier tape 20 by driving roller 21 and driven roller 22, which are the pair of rollers, and fed out in a discharge direction to cover tape discharge path 24. By providing such fins 9*k*, cover tape 20*a* peeled off from carrier tape 20 and fed out can be smoothly discharged.

Figure 23:
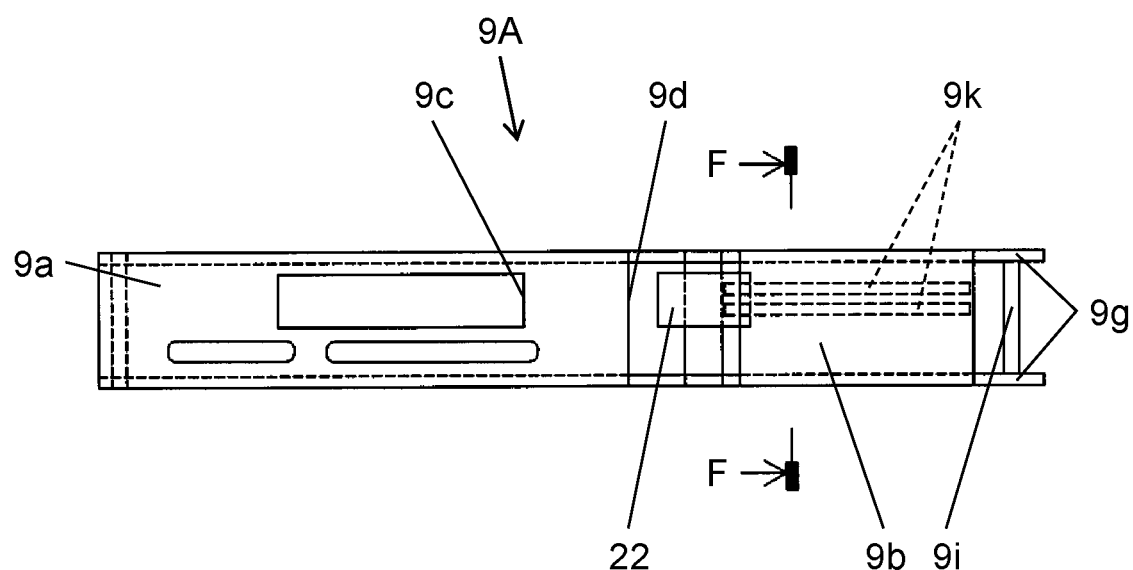
FIG. 23 is an explanatory view of a modified example of the opening/closing cover used in the component supply device of the exemplary embodiment of the present disclosure.
Figure 24:
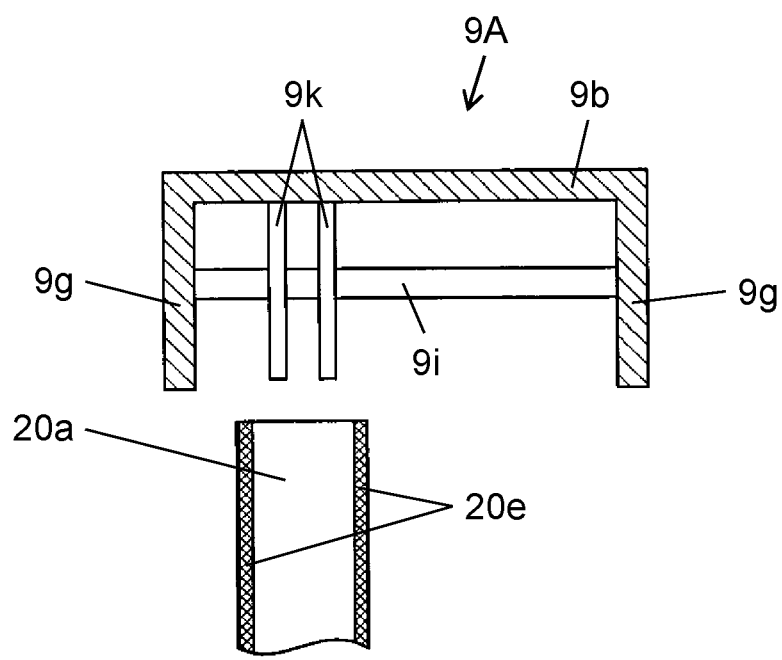
FIG. 24 is a sectional view which is taken along line F-F of FIG. 23.

As illustrated in FIG. 23, two fins 9*k* are disposed in parallel on the lower surface of second cover portion 9*b* at a position corresponding to the position of driven roller 22 in a plan view. As illustrated in F-F cross section of FIG. 24, two fins 9*k* extending downward from a lower surface of second cover portion 9*b* are disposed at positions avoiding marks 20*e* of the adhesive portion remaining attached to a rear surface of cover tape 20*a* in a state of being peeled off from carrier tape 20. By disposing fins 9*k* in this way, it is possible to prevent marks 20*e* of the adhesive portion remaining on peeled-off cover tape 20*a* from adhering to fins 9*k*. Therefore, cover tape 20*a* is stably guided by opening/closing cover 9A, and is smoothly discharged to cover tape discharge path 24. In tape feeder 1 of which the overall configuration is illustrated in FIG. 1, an example is illustrated in which second tape detector 14 that is the connecting portion detector is disposed in tape transport path 4 that guides carrier tape 20 from insertion port 4*a* to discharge port 4*b* in body 2. In the present exemplary embodiment, the present disclosure is not limited to such an example, and for example, configurations illustrated in FIGS. 26 and 27 may be adopted.

Figure 26:
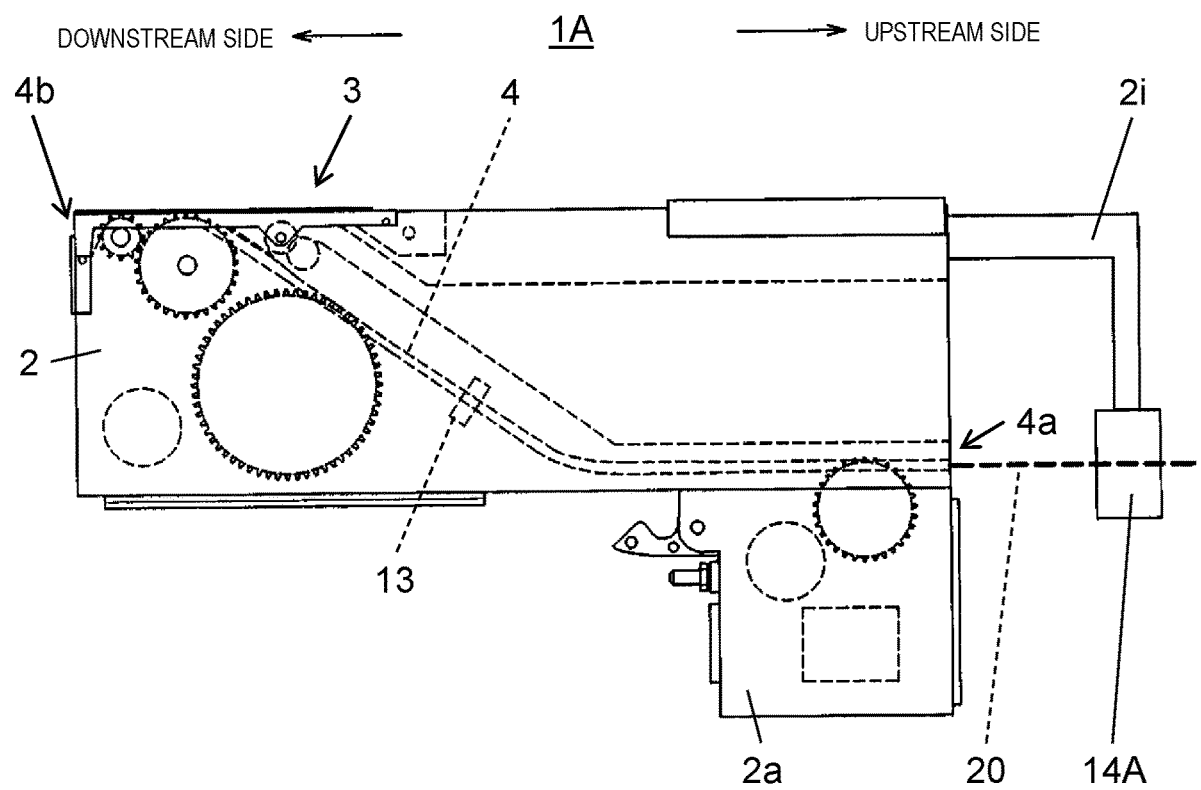
FIG. 26 is an explanatory view of a modified example of a fitting position of a connecting portion detector in the component supply device of the exemplary embodiment of the present disclosure.

Similar to tape feeder 1, in tape feeder 1A illustrated in FIG. 26, a configuration is illustrated, which includes body 2 provided with tape transport path 4 for guiding carrier tape 20 from insertion port 4*a* to discharge port 4*b*. In tape feeder 1A illustrated in FIG. 26, similar to second tape detector 14, a configuration example is illustrated, in which second tape detector 14A which has a function of detecting the connecting portion is disposed on a movement path of carrier tape 20 before carrier tape 20 is introduced into tape transport path 4. That is, in this configuration example, second tape detector 14A, which is disposed at a position separated from insertion port 4*a* in the movement path of carrier tape 20, is held in holding member 2*i* extending from body 2 to the upstream side.

Figure 27:
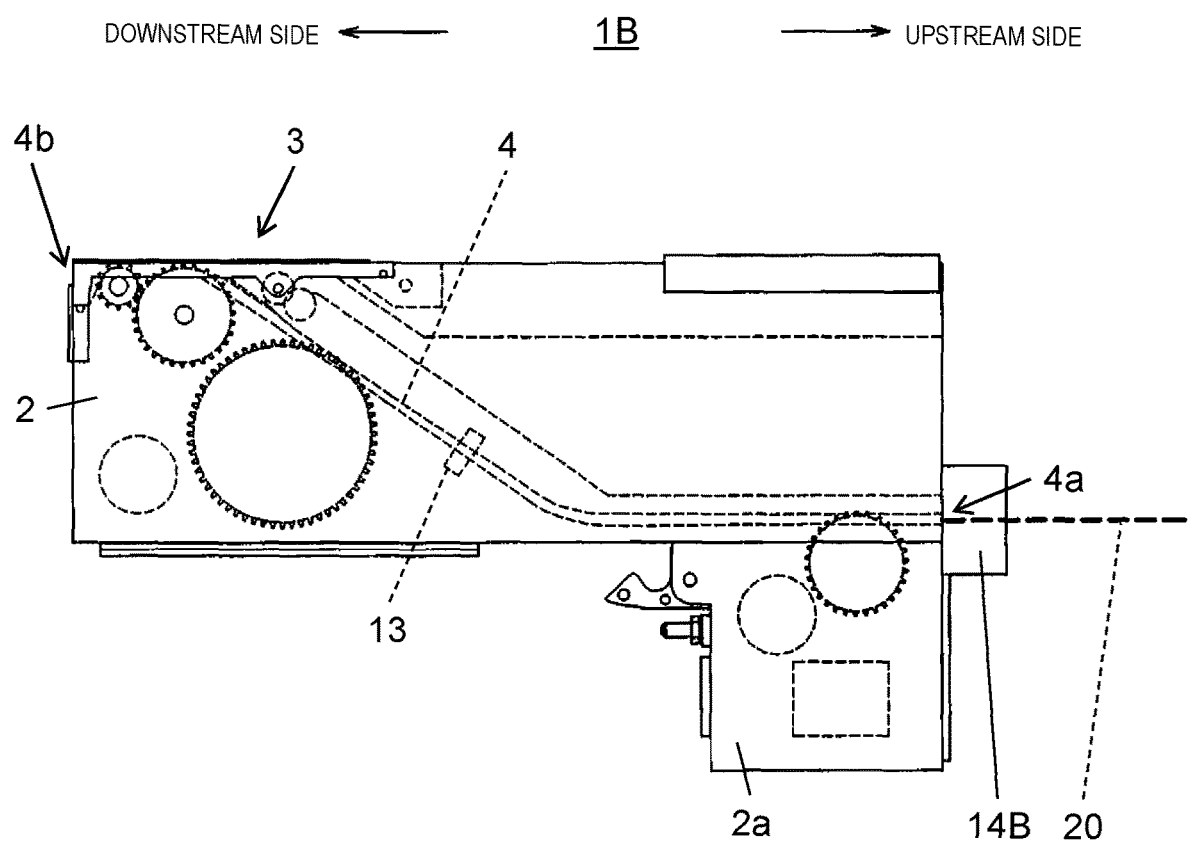
FIG. 27 is an explanatory view of a modified example of a fitting position of the connecting portion detector in the component supply device of the exemplary embodiment of the present disclosure.

In tape feeder 1B illustrated in FIG. 27, similar to tape feeder 1, a configuration is illustrated, which includes body 2 provided with tape transport path 4 for guiding carrier tape 20 from insertion port 4*a* to discharge port 4*b*. In tape feeder 1B illustrated in FIG. 27, similar to second tape detector 14, a configuration example is illustrated, in which second tape detector 14B having a function of detecting the connecting portion is disposed in insertion port 4*a* for inserting carrier tape 20 into tape transport path 4. That is, in this configuration example, second tape detector 14B is disposed at a position matching with insertion port 4*a* on an end surface on the upstream side of body 2.

As described above, tape feeder 1 illustrated in the present exemplary embodiment is a component supply device in which in a state where preceding carrier tape 20 and succeeding carrier tape 20 are not connected, succeeding carrier tape 20 following preceding carrier tape 20 is fed to component pickup position 4*c* and thereby component P stored in carrier tape 20 can be supplied to component installation device M. Tape feeder 1 includes body 2, first carrier tape transporter 15, second carrier tape transporter 16, and feeder controller 12.

Body 2 has tape transport path 4 that guides carrier tape 20 from insertion port 4*a* to discharge port 4*b*.

First carrier tape transporter 15 is disposed on the downstream portion of tape transport path 4 and transports carrier tape 20 to component pickup position 4*c*.

Second carrier tape transporter 16 transports carrier tape 20 from upstream of tape transport path 4 to first carrier tape transporter 15.

Feeder controller 12 can communicate with component installation device M, and operates first carrier tape transporter 15 and second carrier tape transporter 16 in one mode selected from a plurality of operation modes.

In this configuration, by including the automatic loading mode and the splicing mode in the plurality of operation modes, it is possible to supply components by the same tape feeder 1 by either the automatic loading method or the splicing method.

Mounting board manufacturing system 100 illustrated in the present exemplary embodiment includes tape feeder 1 and component installation device M.

Tape feeder 1 is a component supply device in which in a state where preceding carrier tape 20 and succeeding carrier tape 20 are not connected, the component stored in succeeding carrier tape 20 following preceding carrier tape 20 can be supplied to component pickup position 4c.

Component installation device M picks up the component from component pickup position 4c and installs the component in board 103.

Tape feeder 1 includes body 2, first carrier tape transporter 15, second carrier tape transporter 16, and feeder controller 12.

Body 2 has tape transport path 4 that guides carrier tape 20 from insertion port 4a to discharge port 4b.

First carrier tape transporter 15 is disposed on the downstream portion of tape transport path 4 and transports carrier tape 20 to component pickup position 4c.

Second carrier tape transporter 16 transports carrier tape 20 from upstream of tape transport path 4 to first carrier tape transporter 15.

Feeder controller 12 can communicate with the detector for detecting the connecting portion between preceding carrier tape 20 and succeeding carrier tape 20, or the end portion of carrier tape 20 on tape transport path 4, and component installation device M, and operates first carrier tape transporter 15 and second carrier tape transporter 16 in one mode selected from the plurality of operation modes.

Component installation device M transmits a command to tape feeder 1 based on the selected operation mode.

By including the automatic loading mode and the splicing mode in the plurality of operation modes, components can be supplied by the same tape feeder 1 by either the automatic loading method or the splicing method.

Figure 18:
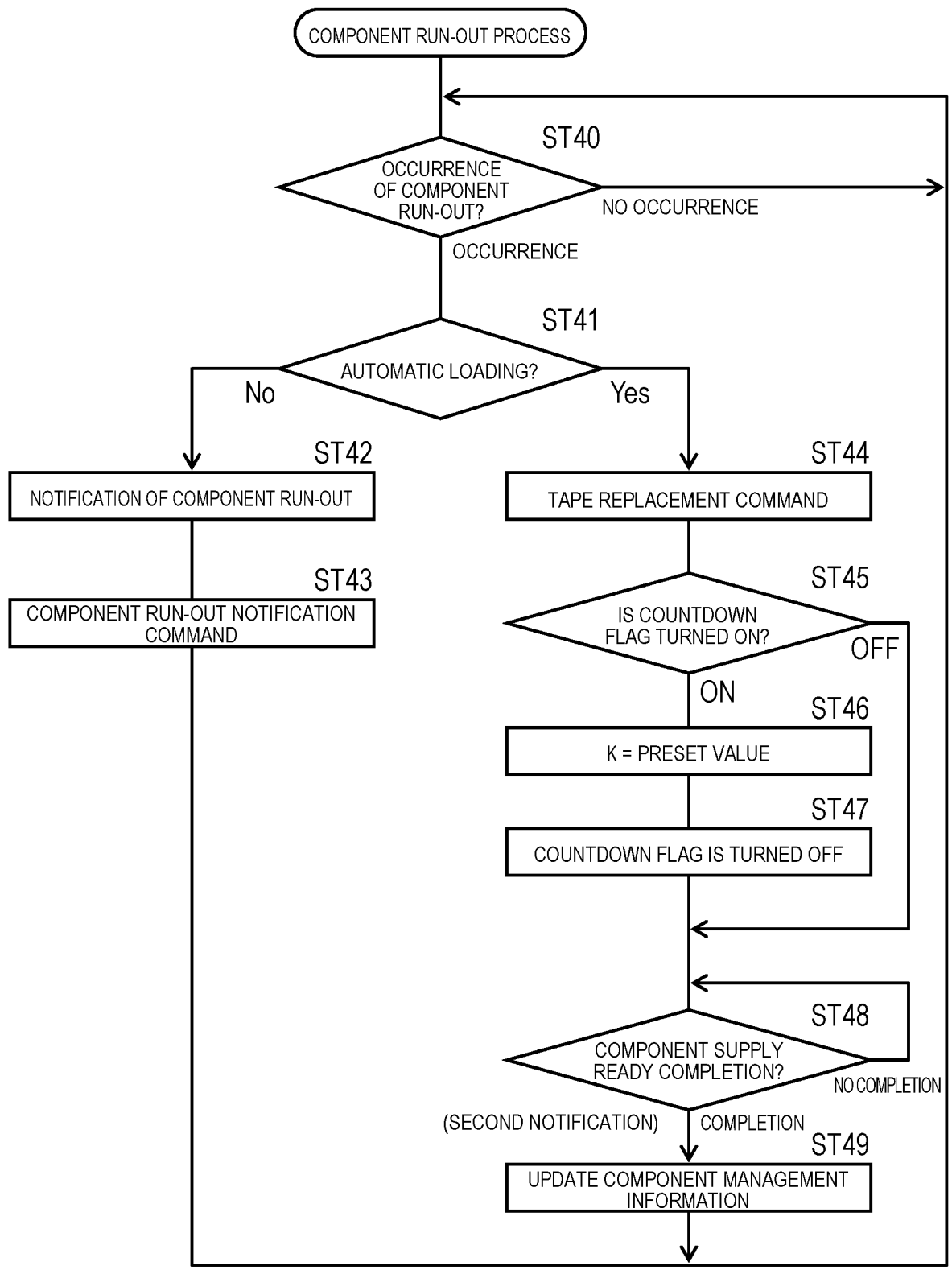
FIG. 18 is a flowchart of a component run-out process in the component supply device according to the exemplary embodiment of the present disclosure.
Figure 19:
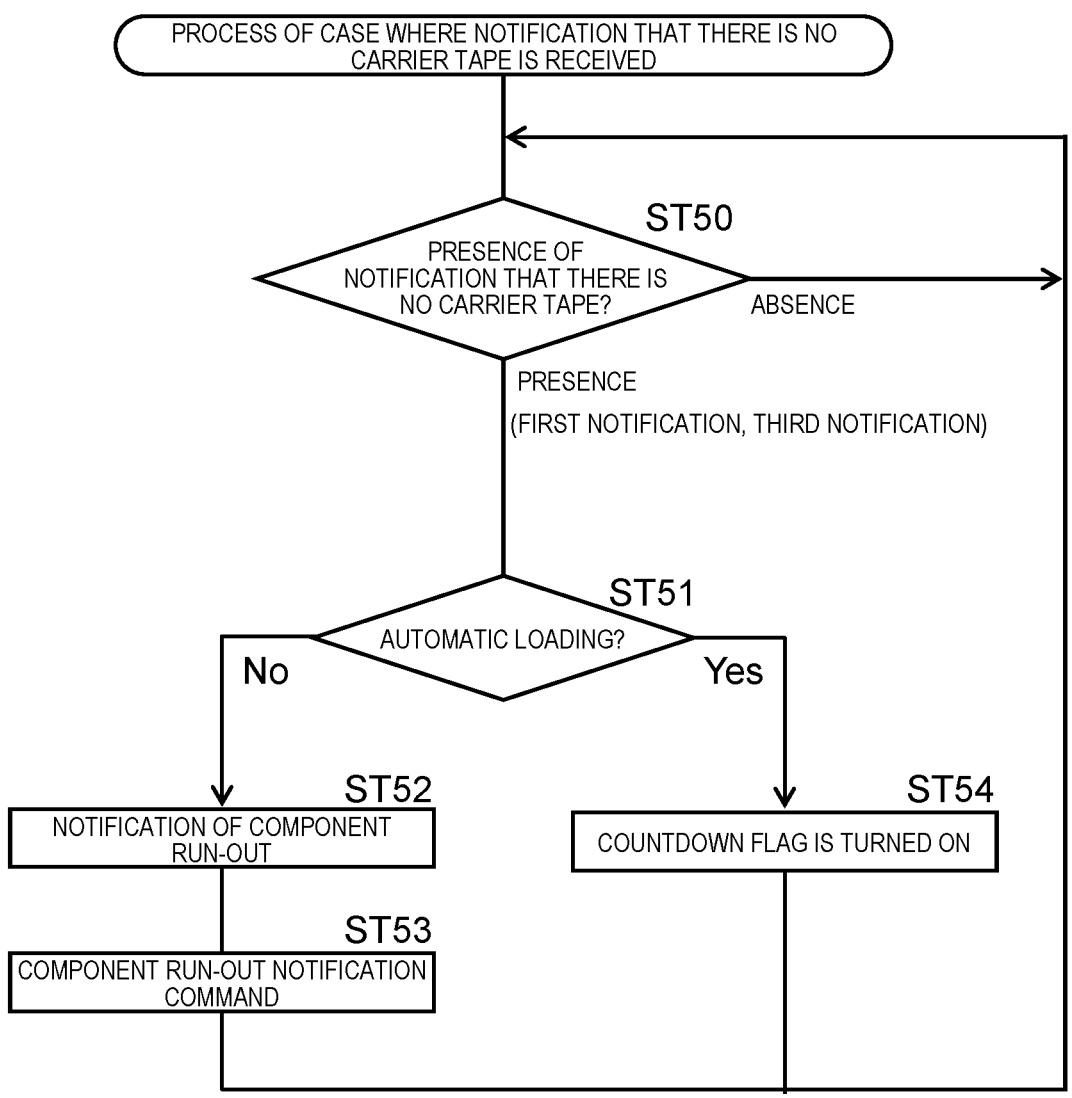
FIG. 19 is a flowchart of a process in a case where a notification that the carrier tape is absent is received in the component supply device according to the exemplary embodiment of the present disclosure.
Figure 21:
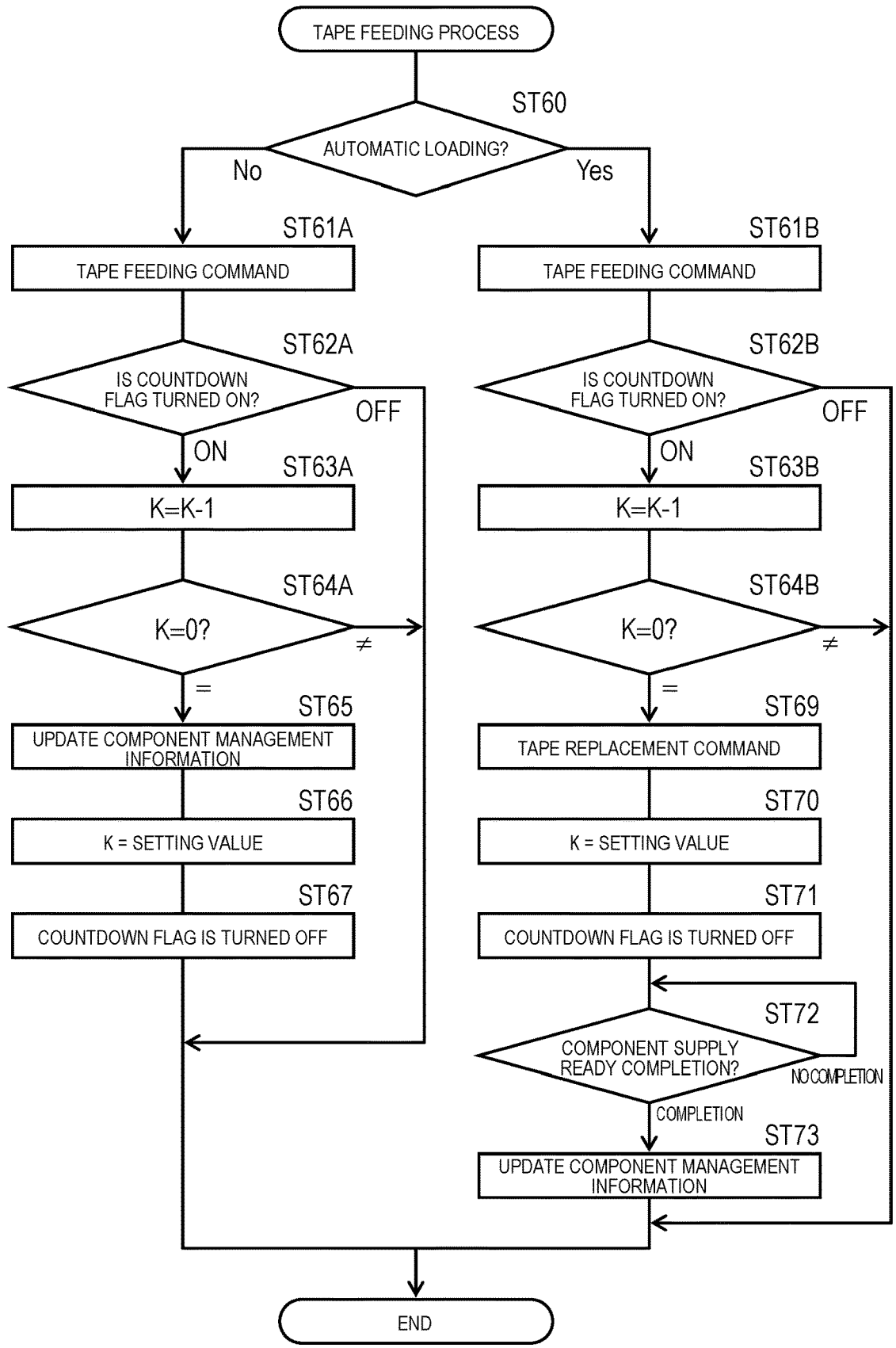
FIG. 21 is a flowchart of a tape feeding process in the component supply device according to the exemplary embodiment of the present disclosure.

Component installation device M of mounting board manufacturing system 100 of the above exemplary embodiment specifies the operation mode of tape feeder 1 with the information for specifying the operation mode stored in operation mode storage unit 12a of feeder controller 12 (ST41 in FIG. 18, ST51 in FIG. 19, ST60 in FIG. 21). However, the operation mode of the tape feeder may be specified based on the information stored in the storage unit of mounting controller 44 of component installation device M or a storage unit of an external processing device accessible by mounting controller 44. As an example, the information for specifying the operation mode included in production program 44a stored in the storage unit included in mounting controller 44 may be used.

According to the present disclosure, the component can be supplied by either the automatic loading method or the splicing method.

INDUSTRIAL APPLICABILITY

The component supply device of the present disclosure has an effect that the component can be supplied by either the automatic loading method or the splicing method, and is useful in the technical field of supplying the component stored in the carrier tape to the component installation device.

REFERENCE MARKS IN THE DRAWINGS 1, 1A, 1B tape feeder
2 body
2a convex portion
2b fitting rail
2c connector
2d air joint
2e hook
2f cover tape storage unit
2h front cover
2i holding member
3 tape transporter
4 tape transport path
4a insertion port
4b discharge port
4c component pickup position
4e climbing section
5 motor
6 transport sprocket
7 sprocket
7a engagement pin
8 discharge sprocket
8a engagement pin
9 opening/closing cover
9A opening/closing cover
9a cover portion
9b cover portion
9c opening portion
9d opening portion
9e portion
9f portion
9h fixing pin
9i locking pin
9j hanging portion
9k fin
10 tape carry-in sprocket
11 motor
12 feeder controller
12a operation mode storage unit
13 first tape detector
14, 14A, 14B second tape detector
15 first carrier tape transporter
16 second carrier tape transporter
17 opening/closing cover holder
17a urging spring
18 opening/closing cover locking unit
18a locking block
18b pivot pin
18c locking member
18d urging spring
20 carrier tape
20a cover tape
20b storage portion
20c hole
20d mark
20e mark
20f rear end portion
21 driving roller
22 driven roller
23 tape guide
23a peeler 23b opening portion
24 cover tape discharge path
31 sprocket gear
32 discharge sprocket gear
33 fourth transmission gear
34 transport sprocket gear
35 third transmission gear
36 peeling-off roller gear
37 fifth transmission gear
38 sixth transmission gear
41 button
42 display unit
43 lamp
44 mounting controller
44a production program
50 driving gear
51 first transmission gear
52 second transmission gear
100 mounting board manufacturing system
101 base
102 board transport mechanism
103 board
104 component supplier
105 installation head
201 short tape
201a dummy tape
M component installation device

The invention claimed is:

1. A component supply device configured to supply a component stored in a carrier tape to a component installation device, comprising:
a body that includes a tape transport path guiding the carrier tape from an insertion port to a discharge port;
a first carrier tape transporter that is disposed at a downstream portion of the tape transport path and transports the carrier tape to a component pickup position;
a second carrier tape transporter that transports the carrier tape from upstream of the tape transport path to the first carrier tape transporter; and
a controller that is configured to communicate with the component installation device and control the first carrier tape transporter and the second carrier tape transporter in one operation mode selected from a plurality of operation modes,
wherein in a state where a preceding carrier tape and a succeeding carrier tape each being the carrier tape are not connected to each other, a component stored in the succeeding carrier tape is supplied to the component installation device by feeding the succeeding carrier tape following the preceding carrier tape to a component pickup position,
wherein among the plurality of operation modes, a first operation mode is an operation mode for feeding the succeeding carrier tape following the preceding carrier tape to the component pickup position in a state where the preceding carrier tape and the succeeding carrier tape are not connected, and
wherein among the plurality of operation modes, a second operation mode is an operation mode for feeding the preceding carrier tape and the succeeding carrier tape connected by a connecting portion to the component pickup position.

2. The component supply device of claim 1,
wherein the controller has an operation mode storage unit that stores information for specifying the selected operation mode.

3. The component supply device of claim 1, further comprising:
a detector for detecting a connecting portion between the preceding carrier tape and the succeeding carrier tape, or an end portion of the carrier tape in the tape transport path,
wherein the plurality of operation modes include
the first operation mode having
a first notification to notify the component installation device when the detector detects a passage of a rear end of the preceding carrier tape, and
a second notification to notify the component installation device when a component stored in the succeeding carrier tape following the preceding carrier tape is stopped at the component pickup position, and
the second operation mode having
a third notification to notify the component installation device when the detector detects the passage of the rear end of the carrier tape, and
a fourth notification to notify the component installation device when the detector detects the connecting portion.

4. The component supply device of claim 3,
wherein the detector includes a connecting portion detector that detects the connecting portion, and a carrier tape detector that detects a presence or absence of the carrier tape in the tape transport path.

5. The component supply device of claim 3,
wherein the detector is an optical sensor that detects the connecting portion and a presence or absence of the carrier tape in the tape transport path.

6. The component supply device of claim 3,
wherein in the first operation mode, when the succeeding carrier tape following the preceding carrier tape is fed to the component pickup position by a tape replacement command from the component installation device,
the passage of the rear end of the preceding carrier tape and a passage of a tip of the succeeding carrier tape are detected by the detector, and
the component stored in the succeeding carrier tape is stopped at the component pickup position.

7. The component supply device of claim 3,
wherein the plurality of operation modes further include a third operation mode in which an actual detection result of the detector is ignored and the first carrier tape transporter is controlled.

8. A method for operating a component supply device configured to supply a component to a component installation device by feeding a carrier tape to a component pickup position,
in which the component supply device includes:
a body that includes a tape transport path guiding the carrier tape from an insertion port to a discharge port,
a first carrier tape transporter that is disposed at a downstream portion of the tape transport path and transports the carrier tape to a component pickup position,
a second carrier tape transporter that transports the carrier tape from upstream of the tape transport path to the first carrier tape transporter,
detector for detecting a connecting portion between a preceding carrier tape and a succeeding carrier tape passing through the tape transport path, or an end portion of the carrier tape, and
a controller that controls the first carrier tape transporter and the second carrier tape transporter,
wherein the method for operating a component supply device operates in one operation mode selected from a plurality of operation modes having a first operation mode and a second operation mode, when the first operation mode is selected, performs a first notification to the component installation device when the detector detects a passage of a rear end of the preceding carrier tape, and performs a second notification to the component installation device when a component stored in the succeeding carrier tape following the preceding carrier tape is stopped at the component pickup position, and when the second operation mode is selected, performs a third notification to the component installation device when the detector detects the passage of the rear end of the carrier tape, and performs a fourth notification to the component installation device when the detector detects the connecting portion between the preceding carrier tape and the succeeding carrier tape.

9. The method for operating a component supply device of claim 8, wherein when a tape replacement command is issued from the component installation device when the first operation mode is selected, the preceding carrier tape is transported by the first carrier tape transporter, and detection of the passage of the rear end of the preceding carrier tape is performed by the detector, and after that, the succeeding carrier tape is transported by the second carrier tape transporter, detection of a passage of a tip of the succeeding carrier tape is performed, and when the passage of the tip of the succeeding carrier tape is detected, the second carrier tape transporter is controlled to perform a heading process of the succeeding carrier tape.

10. The method for operating a component supply device of claim 9, wherein when a third operation mode is selected, a detection result of the detector is ignored and the first carrier tape transporter is controlled.

* * * * *